US012161011B2

(12) United States Patent
Choi et al.

(10) Patent No.: US 12,161,011 B2
(45) Date of Patent: Dec. 3, 2024

(54) DISPLAY DEVICE AND METHOD OF PROVIDING THE SAME

(71) Applicant: Samsung Display Co., Ltd., Yongin-si (KR)

(72) Inventors: Jonghyun Choi, Seoul (KR); Youngwoo Park, Yongin-si (KR); Kwanhee Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 520 days.

(21) Appl. No.: 17/518,711

(22) Filed: Nov. 4, 2021

(65) Prior Publication Data
US 2022/0302405 A1  Sep. 22, 2022

(30) Foreign Application Priority Data

Mar. 19, 2021  (KR) .......... 10-2021-0035938

(51) Int. Cl.
*H10K 50/84* (2023.01)
*B23K 26/50* (2014.01)
*H10K 59/12* (2023.01)
*H10K 59/121* (2023.01)
*H10K 71/00* (2023.01)
(Continued)

(52) U.S. Cl.
CPC ........... *H10K 50/841* (2023.02); *B23K 26/50* (2015.10); *H10K 71/00* (2023.02); *H10K 59/1201* (2023.02); *H10K 59/121* (2023.02); *H10K 77/111* (2023.02); *H10K 2102/311* (2023.02); *H10K 2102/351* (2023.02)

(58) Field of Classification Search
CPC .. H10K 50/841; H10K 71/00; H10K 59/1201; H10K 59/121; H10K 77/111; H10K 2102/311; H10K 2102/351; H10K 59/131; H10K 59/8791; H10K 59/129; H10K 59/38; H10K 59/40; H10K 59/65; H10K 59/873; H10K 71/50; B23K 26/50; B23K 2101/42; B23K 2103/172; B23K 26/402; B23K 26/364; H01L 23/562; G09F 9/301
See application file for complete search history.

(56) References Cited

U.S. PATENT DOCUMENTS 9,203,050 B2  12/2015 Jeong et al.
2016/0275830 A1*  9/2016 You ................... G02F 1/133305
(Continued)

FOREIGN PATENT DOCUMENTS

KR      10-2057612 B1    12/2019
KR   1020200074700 A     6/2020
(Continued)

*Primary Examiner* — Joe E. Schoenholtz
(74) *Attorney, Agent, or Firm* — CANTOR COLBURN LLP

(57) ABSTRACT

A method of providing a display device includes preparing a display panel including a first area, a bending area extending from the first area, and a second area extending from the bending area, attaching an impact absorbing layer to the display panel, removing a first removal portion of a first release film which overlaps the second area, among portions of the first release film disposed on the impact absorbing layer, and providing a cover tape on a first portion of the impact absorbing layer from which the first removal portion is removed.

20 Claims, 16 Drawing Sheets

(51) Int. Cl.
*H10K 77/10* (2023.01)
*H10K 102/00* (2023.01)

(56) References Cited

U.S. PATENT DOCUMENTS

2020/0194712 A1\* 6/2020 Choi .................. H10K 59/12
2020/0264668 A1    8/2020 Baek et al.
2020/0310577 A1   10/2020 Jeon et al.

FOREIGN PATENT DOCUMENTS

KR   1020200099632 A    8/2020
KR   1020200115751 A   10/2020

\* cited by examiner

DISPLAY DEVICE AND METHOD OF PROVIDING THE SAME

This application claims priority to Korean Patent Application No. 10-2021-0035938, filed on Mar. 19, 2021, and all the benefits accruing therefrom under 35 U.S.C. § 119, the contents of which are hereby incorporated by reference in its entirety.

BACKGROUND

1. Field

The present disclosure relates to a display device and a method of providing the display device.

2. Description of the Related Art

A display device includes a display panel that displays an image and a window that is disposed on the display panel to protect the display panel. The display panel includes pixels generating and displaying the image and a driver which drives the pixels.

With technological development of the display device, a display device including a flexible display panel is being developed. The display panel includes pixels displaying the image and a driving chip which drives the pixels. The pixels are arranged in a display area of the display panel, and the driving chip is disposed in a non-display area which is adjacent to the display area such as surrounding the display area of the display panel. A bending portion is defined between the driving chip and the display area, and the display device which is bent at the bending portion disposes the driving chip under the display panel.

The display device includes a polarization film disposed on the display panel to reflect an external light. The polarization film is defined as an anti-reflective film against the external light. The polarization film reduces a reflectance of the external light incident to the display panel from above of the display device. As an example, the polarization film includes a retarder and/or a polarizer. However, since the polarization film has a relatively large thickness, an overall thickness of the display device increases when the polarization film is applied to the display device.

SUMMARY

The present disclosure provides a display device capable of reducing impacts applied thereto from outside the display device.

Embodiments provide a method of manufacturing (or providing) a display device. The method of providing the display device includes preparing a display panel including a first area, a bending area extending from the first area, and a second area extending from the bending area, attaching an impact absorbing layer to the display panel, removing a first removal portion of a first release film which overlaps the second area when viewed in a plane, among portions of the first release film on the impact absorbing layer, and providing a cover tape on a first portion of the impact absorbing layer from which the first removal portion is removed when viewed in the plane.

The method may further include removing a second removal portion of the first release film, which overlaps the first area and the bending area when viewed in the plane, and providing a window on a second portion of the impact absorbing layer, which overlaps the first area and the bending area.

The method may further include irradiating a laser beam to a first boundary of the first release film which is between the first removal portion and the second removal portion to cut the first release film at the first boundary.

The first release film may have a thickness of about 40 micrometers to about 60 micrometers. The laser beam may be irradiated to the first boundary multiple times, may not irradiated to the impact absorbing layer, may have an energy of about 5 watts (W) to about 10 W, and may be irradiated to the first boundary five or six times at a speed of about 300 millimeters per second (mm/s).

The first boundary may overlap the second area when viewed in the plane.

The first boundary may overlap the bending area and the second area when viewed in the plane.

The method may further include providing an input sensing unit on the display panel and providing a division pattern and a color filter on the input sensing unit. The impact absorbing layer may be attached onto the division pattern and the color filter.

The impact absorbing layer may continuously extend from the first area to the second area via the bending area.

The impact absorbing layer may include at least one of polyethylene terephthalate, polyethylene naphthalate, polycarbonate, cyclo-olefin polymer, polyethersulfone, polyarylate, and polyimide.

The method may further include irradiating a laser beam to a hole area defined in the display panel and the impact absorbing layer to form a hole through the display panel.

The impact absorbing layer may be spaced apart from a driving integrated circuit (IC) in the second area.

The method may further include irradiating a laser beam to a hole area defined in the display panel to form a hole.

Embodiments provide a display device including a display panel including a first area, a bending area extending from the first area, and a second area extending from the bending area, a driving IC in the second area, an impact absorbing layer on the display panel and continuously extending from the first area to the second area via the bending area, and a window on the impact absorbing layer. The impact absorbing layer is spaced apart from the driving IC in the second area.

The display panel and the impact absorbing layer may be provided with a hole defined therethrough.

The display panel may be provided with a hole defined therethrough, and the hole may not be defined in the impact absorbing layer.

The first area may include a first display area including a first pixel and a transmission area which is around the first pixel, and a second display area defined around the first display area and including a second pixel. The impact absorbing layer may be in the first and second display areas.

The first area may include a first display area including a first pixel and a transmission area which is around the first pixel, and a second display area defined around the first display area and including a second pixel, the impact absorbing layer may be in the second display area, and the impact absorbing layer may be provided with a hole defined therethrough to overlap the first display area.

The display device may further include a cover tape on a first portion of the impact absorbing layer, which overlaps the second area, and the driving IC.

The impact absorbing layer may include at least one of polyethylene terephthalate, polyethylene naphthalate, polycarbonate, cyclo-olefin polymer, polyethersulfone, polyarylate, and polyimide.

The impact absorbing layer may have a thickness of about 20 micrometers to about 200 micrometers.

According to one or more embodiment described above, the impact absorbing layer protects the display panel from external impacts.

As the impact absorbing layer is in the bending area, a conventional bending protective layer is not required. Thus, an overall thickness of the bending area decreases, and a size of a bezel area is reduced in the display device. Also, as the conventional bending protective layer is not used, a cost of providing the display device decreases and a process efficiency is improved.

BRIEF DESCRIPTION OF THE DRAWINGS

The above and other advantages of the present disclosure will become readily apparent by reference to the following detailed description when considered in conjunction with the accompanying drawings where.

DETAILED DESCRIPTION

Figure 1:
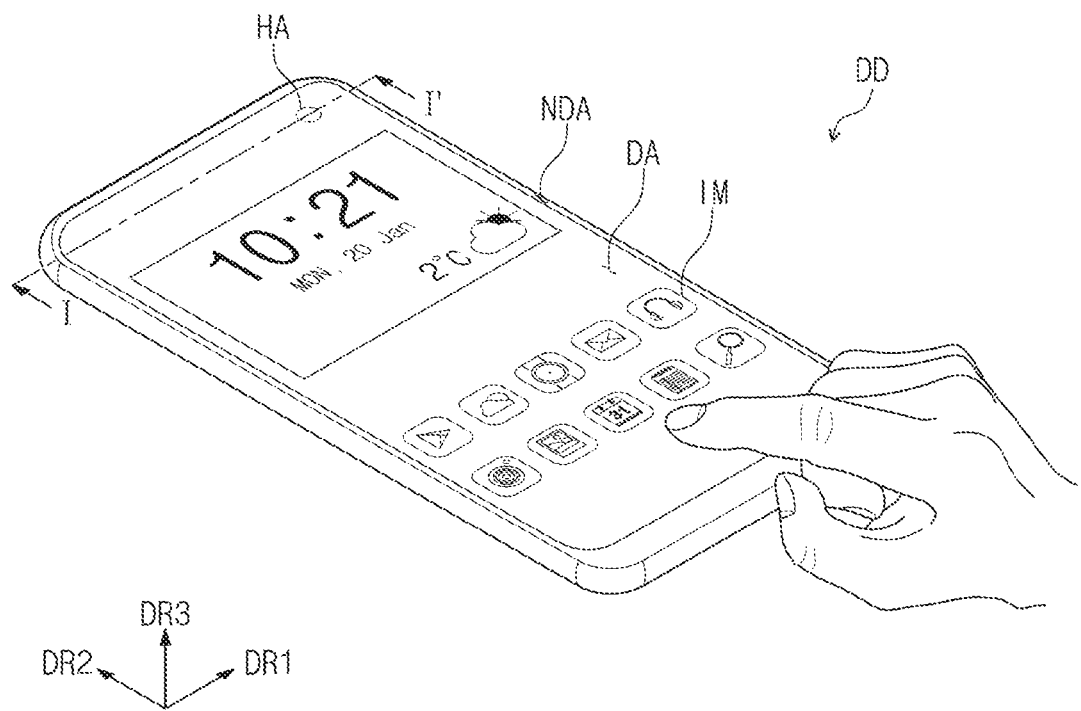
FIG. 1 is a perspective view showing an embodiment of a display device.

In the present disclosure, it will be understood that when an element or layer is referred to as being related to another element such as being "on", "connected to" or "coupled to" another element or layer, it can be directly on, connected or coupled to the other element or layer or intervening elements or layers may be present. In contrast, when an element or layer is referred to as being related to another element such as being "directly on", "directly connected to" or "directly coupled to" another element or layer, no other element or layer or intervening elements or layers are present.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like numerals refer to like elements throughout. In the drawings, the thickness, ratio, and dimension of components are exaggerated for effective description of the technical content.

For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure.

The terminology used herein is for the purpose of describing particular embodiments only and is not intended to be limiting. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the present disclosure will be explained in detail with reference to the accompanying drawings.

FIG. 1 is a perspective view showing an embodiment of a display device DD.

Referring to FIG. 1, the display device DD may include a hole area HA, a display area DA defined adjacent to the hole area HA such as around the hole area HA, and a non-display area NDA defined adjacent to the display area DA such as around the display area DA. Various layers and components of the display device DD may include a hole area HA, a display area DA and a non-display area NDA corresponding to those described above.

In an embodiment, the display area DA may surround the hole area HA, and the non-display area NDA may surround the display area DA. The display area DA may display an image IM, and the non-display area NDA may not display the image IM. The non-display area NDA may define an edge of the display device DD. The edge or edge portion of the display device DD may be printed by a predetermined color to include a printed color.

A camera CAM may be disposed in the hole area HA as a functional element of the display device DD which provides a function thereto. The camera CAM will be shown in FIG. 2. As an example, in the perspective view of FIG. 1, the hole area HA may be defined in the display area DA to be adjacent to an upper side of the display device DD and a right side of the display device DD, however, a position of the hole area HA should not be limited thereto or thereby.

The display device DD may have a rectangular shape defined by short sides extending in or along a first direction DR1 and long sides extending in or along a second direction DR2 which crosses the first direction DR1 (e.g., a planar shape). However, the shape of the display device DD should not be limited to the rectangular shape, and the display device DD may have a variety of shapes, such as a circular shape or a polygonal shape. Each vertex of the rectangular shape of the display device DD may be provided or formed in a curved shape.

Hereinafter, a direction substantially perpendicular to a plane defined by the first direction DR1 and the second direction DR2 which cross each other may be referred to as a third direction DR3 (e.g., a thickness direction). In present disclosure, the expression "when viewed in a plane" or "in a plan view" may mean a view along the third direction DR3.

An upper surface of the display device DD may be referred to as a display surface and may be a plane surface defined by the first direction DR1 and the second direction DR2 crossing each other. Images IM generated by the display device DD may be provided to outside the display device DD such as to a user through the display surface. When the user touches images IM represented at the display surface as icons (e.g., iconic images IM), main images corresponding to the iconic images IM may be provided to the user.

FIG. 1 shows a mobile phone as a representative example of the display device DD. However, the display device DD may be applied to a large-sized electronic item, such as a television set or an outdoor billboard, and a small and medium-sized electronic item, such as a personal computer, a notebook computer, a car navigation unit, a game unit, a tablet computer, and the like. However, these are merely one embodiment, and the display device DD may be applied to other electronic items as long as they do not depart from the concept of the present disclosure.

Figure 2:
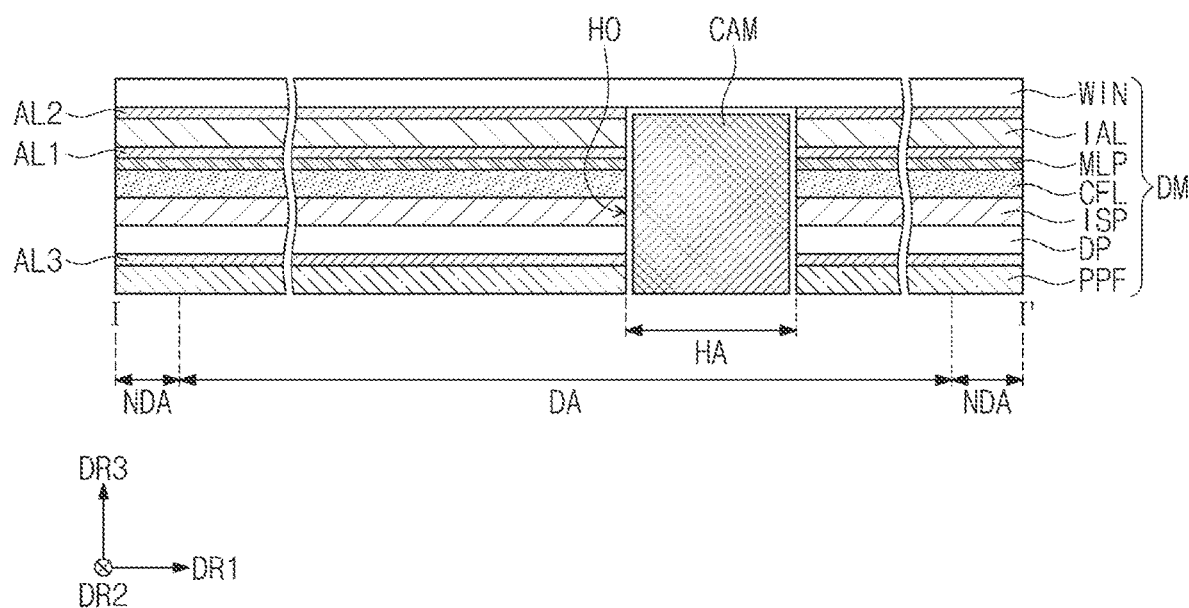
FIG. 2 is a cross-sectional view taken along line I-I' of FIG. 1.

FIG. 2 is a cross-sectional view taken along line I-I' of FIG. 1.

Referring to FIG. 2, the display device DD may include a display module DM. The display module DM may include a display panel DP, an input sensing unit ISP (e.g., input sensing layer), an anti-reflective layer CFL, an optical functional layer MLP, an impact absorbing layer IAL, a window WIN, a panel protective film PPF, and first, second, and third adhesive layers AL1, AL2, and AL3. The input sensing unit ISP, the anti-reflective layer CFL, the optical functional layer MLP, the impact absorbing layer IAL, and the window WIN may be disposed on or above the display panel DP. The panel protective film PPF may be disposed under the display panel DP.

The display module DM may include the hole area HA, the display area DA, and the non-display area NDA as those shown in FIG. 1. A hole HO may be defined at or corresponding to the hole area HA. The hole area HA may be defined around the hole HO. The hole HO may be defined extended through thicknesses of the impact absorbing layer IAL, the optical functional layer MLP, the anti-reflective layer CFL, the input sensing unit ISP, the display panel DP, the panel protective film PPF, and the first to third adhesive layers AL1 to AL3. Sidewalls of the various layers of the display module DM may together define the hole HO. The window WIN may be exposed to a rear of the display device DD at the hole HO. The camera CAM may be disposed in the hole HO.

The display panel DP may be a flexible display panel. According to an embodiment, the display panel DP may be a light-emitting type display panel, however, should not be particularly limited. For instance, the display panel DP may be an organic light emitting display panel or a quantum dot light emitting display panel. A light emitting layer EML of the organic light emitting display panel may include an organic light emitting material. A light emitting layer EML of the quantum dot light emitting display panel may include a quantum dot and a quantum rod. Hereinafter, the organic light emitting display panel will be described as a representative example of the display panel DP.

The input sensing unit ISP may be disposed on the display panel DP. The input sensing unit ISP may include a plurality of sensor units (not shown) to sense an external input incident to the display device DD. The sensor units may sense the external input by a capacitance method. The input sensing unit ISP may be provided or manufactured directly on the display panel DP when the display panel DP is manufactured, however, should not be limited thereto or thereby. The input sensing unit ISP may be attached to the display panel DP by an adhesive layer after being manufactured separately from display panel DP.

The anti-reflective layer CFL may be disposed on the input sensing unit ISP. The anti-reflective layer CFL may reduce a reflectance of the external light incident to the display panel DP from the above of the display device DD.

The optical functional layer MLP may be disposed on the anti-reflective layer CFL. The optical functional layer MLP may be disposed directly on the anti-reflective layer CFL. The optical functional layer MLP may allow a light provided from the display panel DP to advance upward, and thus, a front brightness of the display device DD may be enhanced. The optical functional layer MLP may be omitted.

The impact absorbing layer IAL may be disposed on the optical functional layer MLP. The impact absorbing layer IAL may include a transparent film. The impact absorbing layer IAL may include at least one of polyethylene terephthalate, polyethylene naphthalate, polycarbonate, cyclo-olefin polymer, polyethersulfone, polyarylate, and polyimide, however, a material for the impact absorbing layer IAL should not be limited thereto or thereby.

The window WIN may be disposed on the impact absorbing layer IAL. The window WIN may protect the display panel DP, the input sensing unit ISP, the anti-reflective layer CFL, and the optical functional layer MLP from external scratches and impacts. The window WIN may have an optically transparent property. The external light may be provided to the camera CAM via the window WIN.

The panel protective film PPF may be disposed under the display panel DP. The panel protective film PPF may be referred to as a protective substrate. The panel protective film PPF may protect a lower portion of the display panel DP. The panel protective film PPF may include a flexible plastic material. As an example, the panel protective film PPF may include polyethylene terephthalate (PET).

The window WIN may be disposed in a first area AA1 (refer to FIG. 3) and a bending area BA (refer to FIG. 3) of the display device DD.

The first adhesive layer AL1 may be disposed between the optical functional layer MLP and the impact absorbing layer IAL. The optical functional layer MLP may be attached to the impact absorbing layer IAL by the first adhesive layer AL1.

The second adhesive layer AL2 may be disposed between the window WIN and the impact absorbing layer IAL. The second adhesive layer AL2 may be disposed on a second portion PT2 (refer to FIG. 5) of the impact absorbing layer IAL. The window WIN may be attached to the impact absorbing layer IAL by the second adhesive layer AL2. The window WIN may be attached to the second portion PT2 (refer to FIG. 5) of the impact absorbing layer IAL by the second adhesive layer AL2.

The third adhesive layer AL3 may be disposed between the display panel DP and the panel protective film PPF. The third adhesive layer AL3 may be disposed in the first area AA1 (refer to FIG. 3) and a second area AA2 (refer to FIG. 3) of the display device DD and may not be disposed in the bending area BA (refer to FIG. 3). The display panel DP may be attached to the panel protective film PPF by the third adhesive layer AL3.

The first to third adhesive layers AL1 to AL3 may include a transparent adhesive layer, such as a pressure sensitive adhesive or an optically clear adhesive, however, the adhesive layers should not be limited thereto or thereby.

Figure 3:
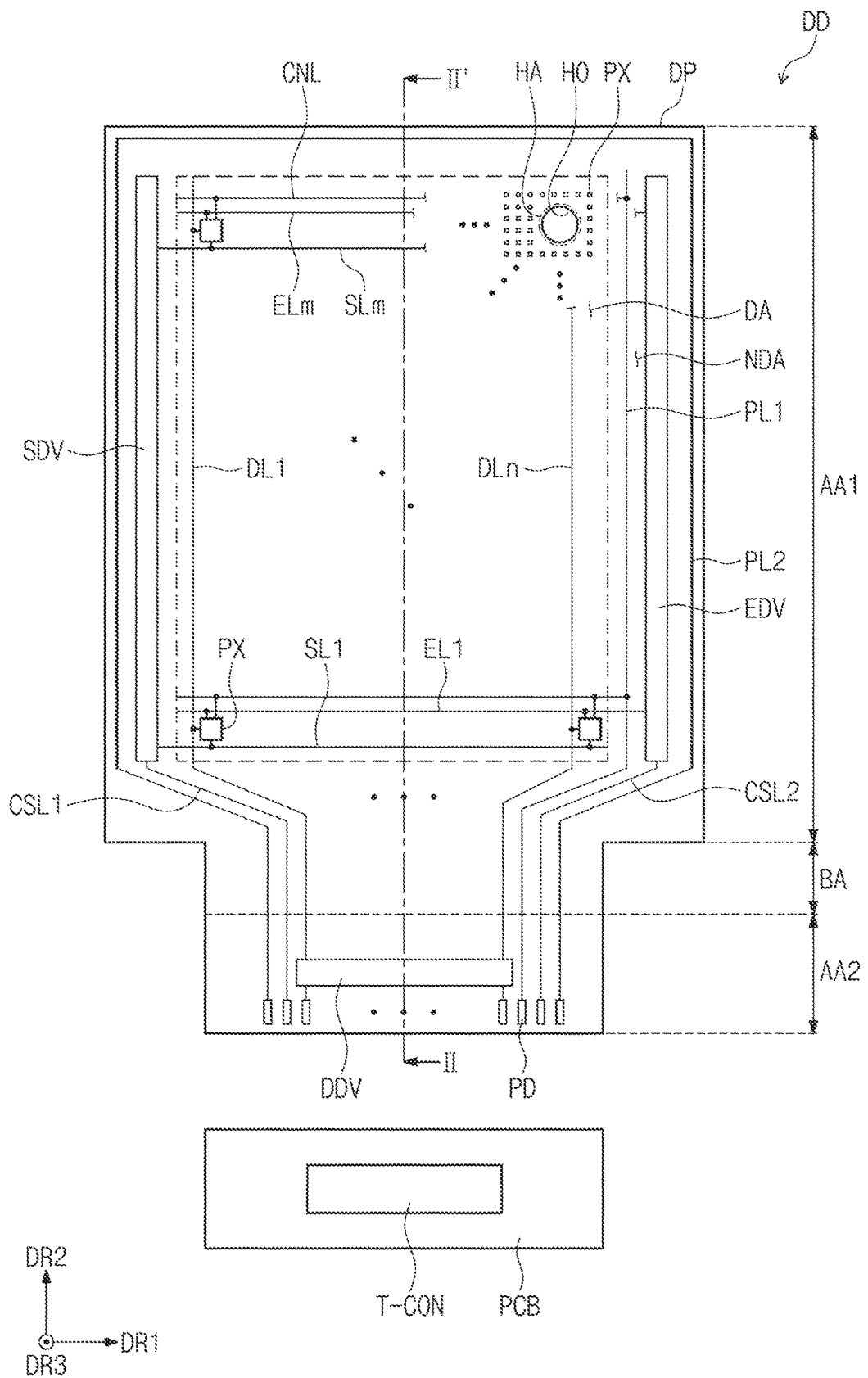
FIG. 3 is a plan view showing an embodiment of the display device shown in FIG. 2.

FIG. 3 is a plan view showing an embodiment of the display device DD shown in FIG. 2.

Referring to FIG. 3, the display device DD may include the display panel DP, a scan driver SDV, a data driver DDV, an emission driver EDV, a printed circuit board PCB, and a timing controller T-CON.

The display panel DP may include the first area AA1, the second area AA2, and the bending area BA which is disposed between the first area AA1 and the second area AA2. The first area AA1, the bending area BA, and the second area AA2 may be arranged in order a direction which is opposite to the second direction DR2, and the bending area BA may extend in the first direction DR1. The bending area BA may extend in a direction which is opposite to the second direction DR2 from the first area AA1, and the second area AA2 may extend in the direction opposite to the second direction DR2 from the bending area BA.

The first area AA1 may include long sides extending in the second direction DR2 and arranged opposite to each other in the first direction DR1. The bending area BA and the second area AA2 may have a length smaller than a length of the first area AA1 in the first direction DR1.

The first area AA1 may include the display area DA and the non-display area NDA which is around the display area DA. In an embodiment, the non-display area NDA may surround the display area DA. The display area DA may display the image IM, and the non-display area NDA may not display the image IM. The second area AA2 and the bending area BA may not display the image. The display panel DP and other components of the display device DD may be bendable at the bending area BA.

The display panel DP may include a pixel PX provided in plural including a plurality of pixels PX, a scan line provided in plural including a plurality of scan lines SL1 to SLm, a data line provided in plural including a plurality of data lines DL1 to DLn, an emission line provided in plural including a plurality of emission lines EL1 to ELm, a control line provided in plural including first and second control lines CSL1 and CSL2, a first power line PL1, a second power line PL2, a connection line CNL provided in plural including a plurality of connection lines CNL, and a pad PD provided in plural including a plurality of pads PD. Each of "m" and "n" is a natural number. The pixels PX may be arranged in the display area DA and may be connected to corresponding ones among the scan lines SL1 to SLm, the data lines DL1 to DLn, and the emission lines EL1 to ELm.

The scan driver SDV and the emission driver EDV may be disposed in the non-display area NDA. The scan driver SDV and the emission driver EDV may be disposed in the non-display area NDA to be respectively adjacent to long sides of the first area AA1. The data driver DDV may be disposed in the second area AA2.

The data driver DDV may be mounted on the second area AA2 such as after being manufactured in an integrated circuit chip form. The data driver DDV may be referred to as a driving integrated circuit (IC).

The scan lines SL1 to SLm may extend in the first direction DR1 and may be connected to the scan driver SDV. The data lines DL1 to DLn may extend in the direction opposite to the second direction DR2 and may be connected to the data driver DDV via the bending area BA. The emission lines EL1 to ELm may extend in the first direction DR1 and may be connected to the emission driver EDV.

The first power line PL1 may extend in the second direction DR2 and may be disposed in the non-display area NDA. The first power line PL1 may be disposed between the display area DA and the emission driver EDV, however, should not be limited thereto or thereby. The first power line PL1 may be disposed between the display area DA and the scan driver SDV.

The first power line PL1 may extend from the first area AA1 to the second area AA2 via the bending area BA. The first power line PL1 may extend to a lower end of the second area AA2 when viewed in a plane. The first power line PL1 may receive a first voltage.

The second power line PL2 may be disposed in the non-display area NDA that faces the second area AA2 with the display area DA interposed therebetween and the non-display area NDA adjacent to the long sides of the first area AA1. The second power line PL2 may be disposed outside of the scan driver SDV and the emission driver EDV. As being outside, the second power line PL2 may be closer to an outer edge of the display device DD than the scan driver SDV and the emission driver EDV.

The second power line PL2 may extend from the first area AA1 to the second area AA2 via the bending area BA. The second power line PL2 may extend along the second direction DR2 in the second area AA2 such that the data driver DDV is disposed between both of opposing ends of the second power line PL2. The second power line PL2 may extend toward the lower end of the second area AA2 when viewed in a plane.

The second power line PL2 may receive a second voltage having a voltage level lower than that of the first voltage. For the convenience of explanation, although a connection relationship is not shown, the second power line PL2 may extend to the display area DA and may be connected to the pixels PX, and the second voltage may be applied to the pixels PX through the second power line PL2.

The connection lines CNL may extend in the first direction DR1 and may be arranged in the second direction DR2. The connection lines CNL may connect the first power line PL1 and the pixels PX to each other. The first voltage may be applied to the pixels PX via the first power line PL1 and the connection lines CNL which are connected to the first power line PL1.

The first control line CSL1 may be connected to the scan driver SDV within the first area AA1 and may extend toward the lower end of the second area AA2 via the bending area BA. The second control line CSL2 may be connected to the emission driver EDV within the first area AA1 and may extend toward the lower end of the second area AA2 via the bending area BA. The data driver DDV may be disposed between the first control line CSL1 and the second control line CSL2 along the first direction DR1, in the second area AA2.

When viewed in a plane, the pads PD may be disposed to be adjacent to the lower end of the second area AA2 (e.g., a distal end of the display panel DP). The data driver DDV, the first power line PL1, the second power line PL2, the first control line CSL1, and the second control line CSL2 may be variously connected to the pads PD.

The data lines DL1 to DLn may be connected to corresponding pads PD through the data driver DDV. In an embodiment, for example, the data lines DL1 to DLn may be connected to the data driver DDV, and the data driver DDV may be connected to the pads PD respectively corresponding to the data lines DL1 to DLn.

The printed circuit board PCB may be connected to the display panel DP at the pads PD. The timing controller T-CON may be disposed on the printed circuit board PCB. The timing controller T-CON may be manufactured in an integrated circuit chip and may be mounted on the printed circuit board PCB. The timing controller T-CON may be connected to the pads PD through the printed circuit board PCB.

Although not shown in figures, the display device DD may further include a voltage generator to generate the first voltage and the second voltage. The voltage generator may be connected to the pads PD variously connected to the first and second power lines PL1 and PL2.

The timing controller T-CON may control an operation of the scan driver SDV, the data driver DDV, and the emission driver EDV. The timing controller T-CON may generate electrical signals such as a scan control signal, a data control signal, and an emission control signal in response to control signals applied thereto from an external source (not shown).

The scan control signal may be applied to the scan driver SDV via the first control line CSL1. The emission control signal may be applied to the emission driver EDV via the second control line CSL2. The data control signal may be applied to the data driver DDV. The timing controller T-CON may receive image signals from outside the timing controller T-CON and/or the display device DD, may convert a data format of the image signals to a format appropriate to an interface between the timing controller T-CON and the data driver DDV, and may provide the image signals having the converted format to the data driver DDV.

The scan driver SDV may generate a plurality of scan signals in response to the scan control signal. The scan signals may be applied to the pixels PX via the scan lines SL1 to SLm. The scan signals may be sequentially applied to the pixels PX.

The data driver DDV may generate a plurality of data voltages corresponding to the image signals in response to the data control signal. The data voltages may be applied to the pixels PX via the data lines DL1 to DLn. The emission driver EDV may generate a plurality of light emitting signals in response to the emission control signal. The light emitting signals may be applied to the pixels PX via the emission lines EL1 to ELm.

The pixels PX may receive the data voltages in response to the scan signals. The pixels PX may emit a light having brightness corresponding to the data voltages in response to the light emitting signals, and thus, may display the image IM. A light emitting time of the pixels PX may be controlled by the light emitting signals.

Figure 4:
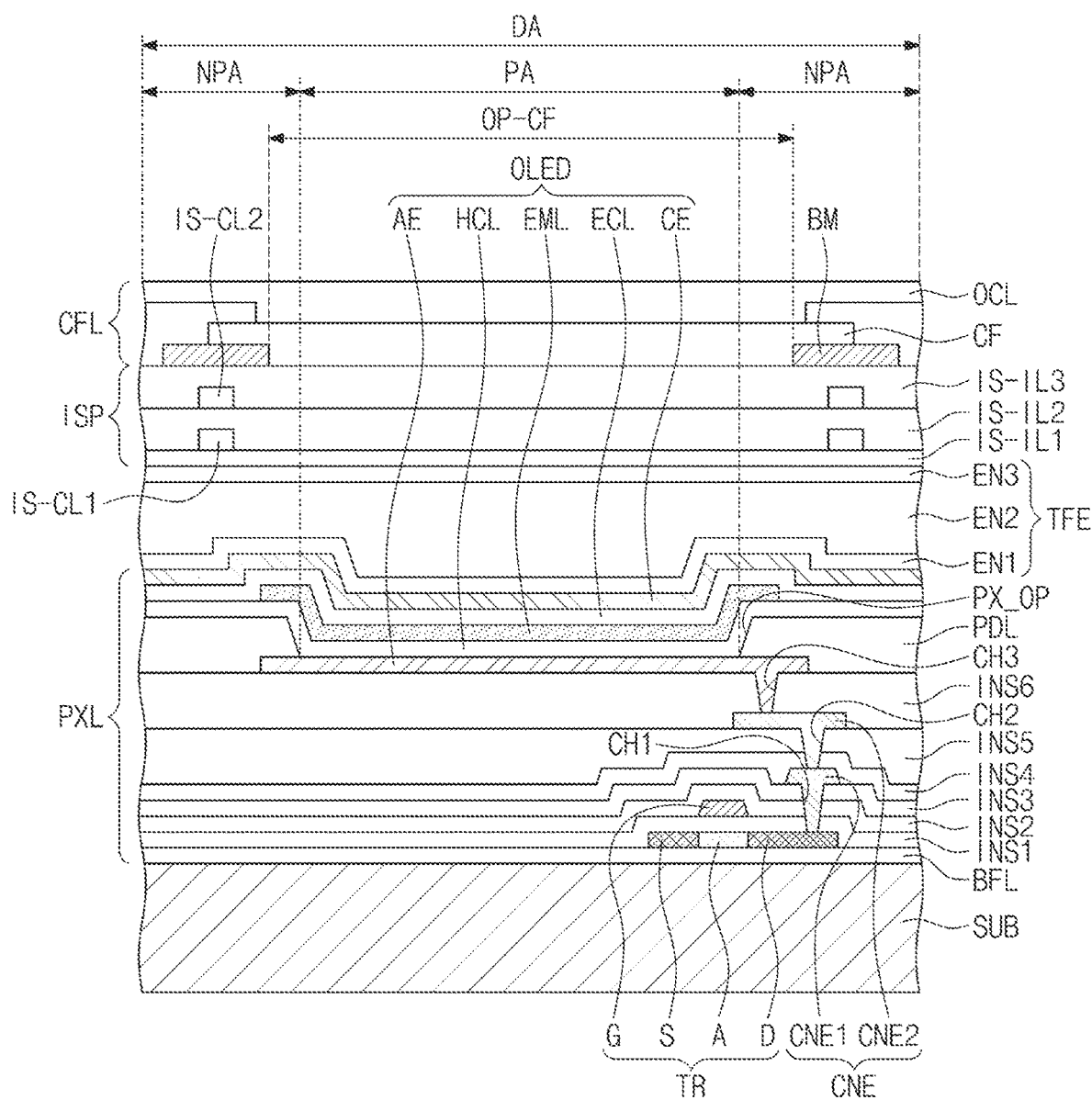
FIG. 4 is a cross-sectional view showing an embodiment of a pixel shown in FIG. 3.

FIG. 4 is a cross-sectional view showing an embodiment of a pixel PX shown in FIG. 3.

Referring to FIG. 4, a pixel layer PXL may be disposed on a substrate SUB and may include a transistor TR and a light emitting element OLED. The light emitting element OLED may include a first electrode AE, a second electrode CE facing the first electrode AE, and a hole control layer HCL, an electron control layer ECL and a light emitting layer EML. The first electrode AE may be an anode electrode, and the second electrode CE may be a cathode electrode.

The transistor TR and the light emitting element OLED may be disposed on the substrate SUB. In FIG. 4, one transistor TR is shown as an example, however, the pixel PX may include a plurality of transistors and at least one capacitor to drive the light emitting element OLED.

The display area DA may include a light emitting area PA corresponding to each pixel PX and a non-light-emitting area NPA which is adjacent to the light emitting area PA such as being around the light emitting area PA. The light emitting element OLED may be disposed in or corresponding to the light emitting area PA. The display area DA may have a plurality of light emitting areas PA.

The substrate SUB may include a flexible plastic substrate. As an example, the substrate SUB may include transparent polyimide (PI). A buffer layer BFL may be disposed on the substrate SUB, and the buffer layer BFL may be an inorganic layer. A semiconductor pattern may be disposed on the buffer layer BFL. The semiconductor pattern may include polycrystalline silicon, however, should not be limited thereto or thereby. The semiconductor pattern may include amorphous silicon or metal oxide.

The semiconductor pattern may be doped with an N-type dopant or a P-type dopant. The semiconductor pattern may have different electrical properties depending on being doped or not or whether being doped with the P-type dopant or the N-type dopant. The semiconductor pattern may include a high-doped region and a low-doped region. The high-doped region may have a conductivity greater than that of the low-doped region and may substantially serve as a source electrode and a drain electrode of the transistor TR. The low-doped region may substantially correspond to an active (or channel) of the transistor TR.

A source S (e.g., source area), an active area A, and a drain D (e.g., drain area) of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the first insulating layer INS1 to cover the gate G. A third insulating layer INS3 may be disposed on the second insulating layer INS2.

A connection electrode CNE may be disposed between the transistor TR and the light emitting element OLED to connect the transistor TR to the light emitting element OLED. The connection electrode CNE may include a first connection electrode CNE1 together with a second connection electrode CNE2.

The first connection electrode CNE1 may be disposed on the third insulating layer INS3 and may be connected to the drain D via a first contact hole CH1 defined through the first, second, and third insulating layers INS1, INS2, and INS3. A fourth insulating layer INS4 may be disposed on the third insulating layer INS3 to cover a portion of the first connection electrode CNE1. A fifth insulating layer INS5 may be disposed on the fourth insulating layer INS4.

The second connection electrode CNE2 may be disposed on the fifth insulating layer INS5 and may be connected to the first connection electrode CNE1 via a second contact hole CH2 defined through the fifth insulating layer INS5. A sixth insulating layer INS6 may be disposed on the fifth insulating layer INS5 to cover a portion of the second connection electrode CNE2. Each of the first to sixth insulating layers INS1 to INS6 may be an inorganic layer or an organic layer.

The first electrode AE may be disposed on the sixth insulating layer INS6. The first electrode AE may be connected to the second connection electrode CNE2 via a third contact hole CH3 defined through the sixth insulating layer INS6. A pixel definition layer PDL may be disposed on the first electrode AE and the sixth insulating layer INS6 to expose a portion of the first electrode AE to outside the pixel definition layer PDL. The pixel definition layer PDL may be provided with a pixel opening PX_OP defined therethrough to expose the portion of the first electrode AE to outside the pixel definition layer PDL.

The hole control layer HCL may be disposed on the first electrode AE and the pixel definition layer PDL. The hole control layer HCL may be commonly disposed in the light emitting area PA and the non-light-emitting area NPA. The hole control layer HCL may include a hole transport layer and a hole injection layer.

The light emitting layer EML may be disposed on the hole control layer HCL. The light emitting layer EML may be disposed in an area corresponding to the pixel opening PX_OP. The light emitting layer EML may include an organic material and/or an inorganic material. The light emitting layer EML may generate a light having one of red, green, and blue colors.

The electron control layer ECL may be disposed on the light emitting layer EML and the hole control layer HCL. The electron control layer ECL may be commonly disposed in the light emitting area PA and the non-light-emitting area NPA. The electron control layer ECL may include an electron transport layer and an electron injection layer.

The second electrode CE may be disposed on the electron control layer ECL. The second electrode CE may be commonly disposed over the pixels PX. Layers from the buffer layer BFL to the light emitting element OLED may be together referred to as the pixel layer PXL.

A thin film encapsulation layer TFE may be disposed on the light emitting element OLED. The thin film encapsulation layer TFE may be disposed on the second electrode CE to cover the pixel PX. The thin film encapsulation layer TFE may include a plurality of layers including a first encapsulation layer EN1 disposed on the second electrode CE, a second encapsulation layer EN2 disposed on the first encapsulation layer EN1, and a third encapsulation layer EN3 disposed on the second encapsulation layer EN2.

Each of the first and third encapsulation layers EN1 and EN3 may be an inorganic layer, and the second encapsulation layer EN2 may be an organic layer. The first and third encapsulation layers EN1 and EN3 may protect the pixel PX from moisture and oxygen. The second encapsulation layer EN2 may protect the pixel PX from a foreign substance such as dust particles.

The first voltage may be applied to the first electrode AE through the transistor TR, and the second voltage, which has a voltage level lower than that of the first voltage, may be applied to the second electrode CE. Holes and electrons injected into the light emitting layer EML may be recombined to generate excitons, and the light emitting element OLED may emit the light by the excitons that return to a ground state from an excited state.

The input sensing unit ISP may be disposed directly on the thin film encapsulation layer TFE. The input sensing unit ISP may include a first sensing insulating layer IS-IL1, a first conductive layer IS-CL1, a second sensing insulating layer IS-IL2, a second conductive layer IS-CL2, and a third sensing insulating layer IS-IL3 in order from the pixel layer PXL. According to an embodiment, the first sensing insulating layer IS-IL1 and/or the third sensing insulating layer IS-IL3 may be omitted.

Each of the first conductive layer IS-CL1 and the second conductive layer IS-CL2 may have a single-layer structure or a multi-layer structure of layers stacked in the third direction DR3. The conductive layer having the multi-layer structure may include at least two layers among transparent conductive layers and metal layers. The conductive layer having the multi-layer structure may include metal layers including different metal materials. The transparent conductive layer may include indium tin oxide (ITO), indium zinc oxide (IZO), zinc oxide (ZnO), indium tin zinc oxide (ITZO), PEDOT, metal nanowire, and graphene. The metal layer may include molybdenum, silver, titanium, copper, aluminum, and an alloy thereof. For instance, each of the first conductive layer IS-CL1 and the second conductive layer IS-CL2 may have a three-layer structure of metal layers, such as titanium/aluminum/titanium. Metal layers having relatively high durability and low reflectance may be disposed as upper and lower layers, respectively, and a metal layer having relatively high electrical conductance may be disposed as an inner layer.

Each of the first conductive layer IS-CL1 and the second conductive layer IS-CL2 may include a conductive pattern provided in plural including a plurality of conductive patterns. Hereinafter, the first conductive layer IS-CL1 will be described as including first conductive patterns, and the second conductive layer IS-CL2 will be described as including second conductive patterns. Each of the first conductive patterns and the second conductive patterns may include sensing electrodes and signal lines which are connected to the sensing electrodes. The first conductive patterns and the second conductive patterns may be disposed to overlap a division pattern BM. The division pattern BM may reduce or effectively prevent external light from being reflected due to the first conductive patterns and the second conductive patterns.

Each of the first sensing insulating layer IS-IL1, the second sensing insulating layer IS-IL2, and the third sensing insulating layer IS-IL3 may include an inorganic layer or an organic layer. In the present embodiment, each of the first sensing insulating layer IS-IL1 and the second sensing insulating layer IS-IL2 may be an inorganic layer. The third sensing insulating layer IS-IL3 may include an organic layer.

The anti-reflective layer CFL may be disposed directly on the input sensing unit ISP. In a case where the external light traveling toward the display panel DP is provided to the user after being reflected by the display panel DP, as if reflected by a mirror, the user may perceive the external light. To prevent this phenomenon, the anti-reflective layer CFL may include the division pattern BM and a color filter CF (e.g., color filter layer), however, should not be limited thereto or thereby. According to an embodiment, the anti-reflective layer CFL may include a retarder and/or a polarizer to reduce the reflectance of the external light.

The division pattern BM may overlap or correspond to the non-light-emitting area NPA. The division pattern BM may include a light blocking pattern having a black color. According to an embodiment, the division pattern BM may include a black coloring agent. The black coloring agent may include a black pigment or a black dye. The black coloring agent may include a metal material, such as a carbon black, a chromium, or an oxide thereof.

The division pattern BM may be provided with a division opening OP-CF corresponding to the pixel opening PX_OP. The division opening OP-CF of the division pattern BM may have a size greater than a size of the pixel opening PX_OP of the pixel definition layer PDL. A size may be determined in a direction along the pixel layer PXL or the display panel DP, such as along the first direction DR1 or the second direction DR2 without being limited thereto.

The color filter CF may correspond to the light emitting layer EML. The color filter CF may transmit one light among lights having red, green, and blue colors. The color filter CF may transmit a light having a color corresponding to a color of a light generated by the light emitting layer EML.

The color filter CF may reduce the reflectance of the external light. The color filter CF may transmit a light in a specific wavelength range and may absorb a light in a wavelength range other than the specific wavelength range, and thus, the color filter CF may absorb most of natural light and may reflect only a portion of the natural light.

The color filter CF may include a base resin and a dye and/or a pigment which is dispersed in the base resin. The base resin may be a medium in which the dye and/or the pigment are dispersed and may include various resin compositions that are referred to as binders.

The anti-reflective layer CFL may include a protective layer OCL to cover the color filter CF. The protective layer OCL may include an organic material, and the protective layer OCL may provide a flat surface. According to an embodiment, the protective layer OCL may be omitted.

The portion of the color filter CF disposed in the non-light-emitting area NPA may be disposed on the division pattern BM. In the present embodiment, the division pattern BM is disposed under the color filter CF, however, should not be limited thereto or thereby. According to an embodiment, the division pattern BM may be disposed above the color filter CF.

Figure 5:
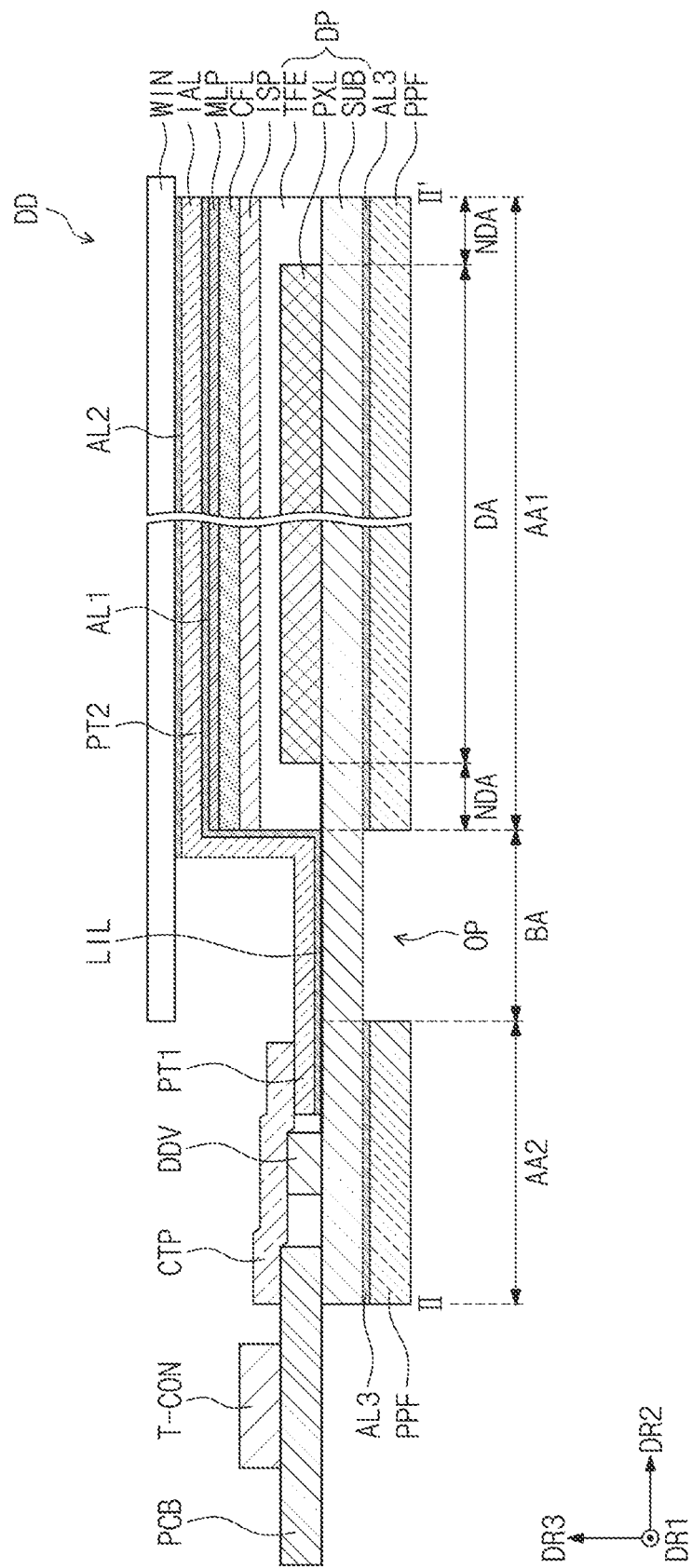
FIG. 5 is a cross-sectional view taken along line II-II' of FIG. 3.

FIG. 5 is a cross-sectional view taken along line II-II' of FIG. 3.

Referring to FIG. 5, the display device DD may include the display panel DP, the panel protective film PPF, the input sensing unit ISP, the anti-reflective layer CFL, the optical functional layer MLP, the impact absorbing layer IAL, the window WIN, the first, second, and third adhesive layers AL1, AL2, and AL3, the data driver DDV, the printed circuit board PCB, the timing controller T-CON, and a cover tape CTP.

The panel protective film PPF may be provided with a protective film opening OP defined therethrough to correspond to the bending area BA. As an example, the panel protective film PPF may be disposed in the first area AA1 and the second area AA2 and may not be disposed in the bending area BA. The panel protective film PPF may be disconnected at the bending area BA. After the panel protective film PPF is disposed under the substrate SUB, a portion of the panel protective film PPF, which overlaps the bending area BA in a plane, may be removed, and the protective film opening OP may be formed.

The pixel layer PXL may be disposed in the first area AA1 of the display panel DP and may overlap the display area DA when viewed in a plane. The pixel layer PXL may be disposed on the substrate SUB in the first area AA1. The pixel layer PXL may not be disposed in the bending area BA and the second area AA2.

The thin film encapsulation layer TFE may be disposed on the pixel layer PXL in the first area AA1. The thin film encapsulation layer TFE may be disposed on the substrate SUB to cover the pixel layer PXL. The thin film encapsulation layer TFE may be disposed in the first area AA1 and may not be disposed in the bending area BA and the second area AA2. That is, the bending area BA and the second area AA2 exclude the thin film encapsulation layer TFE.

The display panel DP may include a line layer LIL extending from the pixel layer PXL. The line layer LIL may include a portion of the data lines DL1 to DLn extending from the first area AA1, through the bending area BA and to the pads PD in the second area AA2 which are shown in FIG. 2. In addition, the line layer LIL may include a portion of the first and second power lines PL1 and PL2 and/or the first and second control lines CSL1 and CSL2. The line layer LIL may be a conductive line or an electrical signal line.

The line layer LIL may extend from the first area AA1, to the bending area BA and to the second area AA2. As an example, the line layer LIL may extend from the pixel layer PXL in the first area AA1, and may be disposed on the substrate SUB in the bending area BA and the second area AA2.

The input sensing unit ISP may be disposed directly on the display panel DP in the first area AA1. The input sensing unit ISP may be disposed in the first area AA1 and may not be disposed in the bending area BA and the second area AA2. That is, the input sensing unit ISP may be excluded from the bending area BA and the second area AA2.

The anti-reflective layer CFL may be disposed in the first area AA1 and may not be disposed in the bending area BA and the second area AA2. That is, the anti-reflective layer CFL may be excluded from the bending area BA and the second area AA2.

The optical functional layer MLP may be disposed on the anti-reflective layer CFL. Although not shown in figures, the optical functional layer MLP may include an organic insulating layer disposed on the anti-reflective layer CFL and provided with openings overlapping the light emitting areas PA and a high refractive layer disposed on the anti-reflective layer CFL to cover the organic insulating layer. The openings may be filled with the high refractive layer. The high refractive layer may have a refractive index higher than that of the organic insulating layer.

The organic insulating layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin. The high refractive layer may include a siloxane-based resin. The high refractive layer may include at least one of a zirconium oxide particle, an aluminum oxide particle, and a titanium oxide particle in addition to the siloxane-based resin.

The light emitted from the light emitting areas PA (refer to FIG. 4) may be provided to the optical functional layer MLP. The light may be reflected by a side surface of the organic insulating layer through which the openings are defined due to a difference in refractive index between the high refractive layer and the organic insulating layer. The light may travel further upwards after being reflected by the side surface of the organic insulating layer through which the openings are defined.

The impact absorbing layer IAL may be disposed in the first area AA1, the bending area BA, and the second area AA2. The impact absorbing layer IAL may continuously extend from the first area AA1 to the second area AA2 via the bending area BA, however, should not be limited thereto or thereby. According to an embodiment, the impact absorbing layer IAL may be disposed in the first area AA1 and the bending area BA but excluded from the second area AA2.

The impact absorbing layer IAL may have a thickness defined by a dimension thereof in the third direction DR3. The impact absorbing layer IAL may have the thickness of about 20 micrometers to about 200 micrometers. However, the thickness of the impact absorbing layer IAL should not be limited thereto or thereby.

As the impact absorbing layer IAL is provided, the display panel DP may be protected from external impacts. Damage applied to portions of the first area AA1, the bending area BA, and the second area AA2 from outside the display panel DP may be reduced by the impact absorbing layer IAL.

The impact absorbing layer IAL may be disposed between the input sensing unit ISP and the window WIN in the first area AA1 and may extend from the first area AA1 to the bending area BA and the second area AA2. The impact absorbing layer IAL may be disposed along a side surface of the thin film encapsulation layer TFE, a side surface of the input sensing unit ISP, a side surface of the anti-reflective layer CFL, and a side surface of the optical functional layer MLP. Due to this structure, the impact absorbing layer IAL may extend from above the thin film encapsulation layer TFE and may extend to the bending area BA to have a step difference.

The impact absorbing layer IAL may be disposed on the line layer LIL in the bending area BA and the second area AA2 to protect the line layer LIL. The impact absorbing layer IAL may complement a mechanical strength of elements disposed in the bending area BA and may reduce or effectively prevent cracks from occurring in the elements disposed in the bending area BA when the elements in the bending area BA are bent. The impact absorbing layer IAL may reduce or effectively prevent the bending area BA and elements therein from external impacts.

According to an embodiment, a separate bending protective layer may not be disposed in the bending area BA, and the impact absorbing layer IAL may extend from the display area DA in the first area AA1, to the bending area BA to protect the bending area BA. Accordingly, the separate bending protective layer may be omitted.

The first adhesive layer AL1 may be disposed between the optical functional layer MLP and the impact absorbing layer IAL in the first area AA1 and may extend from the first area AA1 to the bending area BA and the second area AA2. The first adhesive layer AL1 may be disposed between the impact absorbing layer IAL and the side surface of the thin film encapsulation layer TFE, between the impact absorbing layer IAL and the side surface of the input sensing unit ISP, between the impact absorbing layer IAL and the side surface of the anti-reflective layer CFL, and between the impact absorbing layer IAL and the side surface of the optical functional layer MLP. In addition, the first adhesive layer AL1 may be disposed between the impact absorbing layer IAL and the substrate SUB in the bending area BA, and may be partially disposed between the impact absorbing layer IAL and the substrate SUB in the second area AA2.

The impact absorbing layer IAL may be attached to the side surface of the thin film encapsulation layer TFE, the side surface of the input sensing unit ISP, the side surface of the anti-reflective layer CFL, and the side surface of the optical functional layer MLP by the first adhesive layer AL1. In addition, the impact absorbing layer IAL may be attached to the substrate SUB in the bending area BA and the second area AA2 by the first adhesive layer AL1.

The data driver DDV may be disposed in the second area AA2. The data driver DDV may be mounted on the substrate SUB in the second area AA2. The line layer LIL may extend from the first area AA1 and to the second area AA2 and may be connected to the data driver DDV. The impact absorbing layer IAL may be disposed to be spaced apart from the data driver DDV in a direction along the substrate SUB, however, should not be limited thereto or thereby. According to an embodiment, the impact absorbing layer IAL may be disposed closer to the data driver DDV than what is shown in FIG. 5 and may make contact with a side surface of the data driver DDV. As being in contact, elements may form an interface therebetween without being limited thereto.

The timing controller T-CON may be disposed on the printed circuit board PCB. A portion of the printed circuit board PCB, which does not overlap the timing controller T-CON, may be spaced apart from the data driver DDV in the direction along the substrate SUB and may be disposed in the second area AA2. The printed circuit board PCB may be connected to the substrate SUB and the cover tape CTP in the second area AA2. The timing controller T-CON may be spaced apart from the second area AA2 in the direction along the substrate SUB. The data driver DDV may be disposed between the printed circuit board PCB and the impact absorbing layer IAL in the second area AA2.

Hereinafter, a portion of the impact absorbing layer IAL, which overlaps the second area AA2 when viewed in a plane, may be referred to as a first portion PT1, and a portion of the impact absorbing layer IAL, which overlaps the first area AA1 when viewed in a plane, may be referred to a second portion PT2. The window WIN may be disposed on the second portion PT2 in the first area AA1 and may extend from the first area AA1 to the bending area BA.

The cover tape CTP may be disposed in the second area AA2. The cover tape CTP may be disposed on the data driver DDV. The cover tape CTP may be spaced apart from the timing controller T-CON in the direction along the substrate SUB and may be disposed on a portion of the printed circuit board PCB disposed in the second area AA2. The cover tape CTP may be disposed on the first portion PT1 of the impact absorbing layer IAL disposed in the second area AA2. The cover tape CTP may not be disposed in the bending area BA (e.g., may be excluded from the bending area BA).

As an example, in FIG. 5, an edge of the cover tape CTP disposed on the printed circuit board PCB overlaps an edge of the second area AA2 when viewed in a plane. In an embodiment, an edge of the cover tape CTP may be aligned with an edge of the second area AA2, where the edge of the second area AA2 defines an end of the display panel DP. However, the present disclosure should not be limited thereto or thereby. As an example, the cover tape CTP may extend further from the edge of the second area AA2 and along the printed circuit board PCB to be closer to the timing controller T-CON.

An edge of the cover tape CTP closest to the bending area BA may be spaced apart from a boundary between the bending area BA and the second area AA2 in the direction along the substrate SUB, however, should not be limited thereto or thereby. According to an embodiment, the edge of the cover tape CTP may overlap or be aligned with the boundary between the bending area BA and the second area AA2. The cover tape CTP may include an insulating tape containing an organic material.

Figure 6:
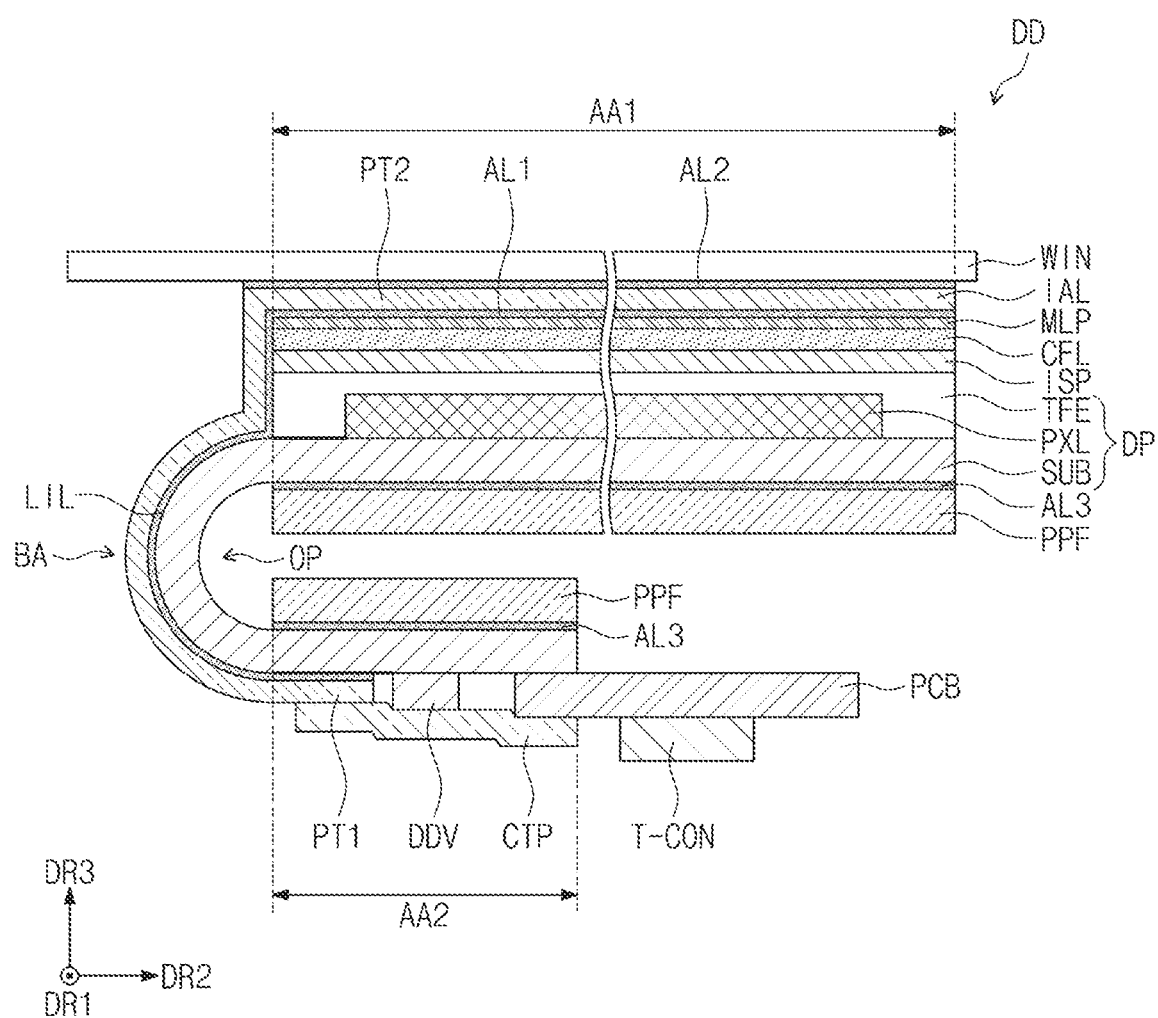
FIG. 6 is a view showing an embodiment of the bending area shown in FIG. 5 which is bent.

FIG. 6 is a view showing an embodiment of the bending area BA shown in FIG. 5 which is bent.

Referring to FIGS. 5 and 6, the display device DD may be bent at the bending area BA such that the second area AA2 is disposed under the first area AA1 along the third direction DR3. The bending area BA may be bent to have a predetermined curvature. Accordingly, the data driver DDV mounted in the second area AA2 may be disposed under or facing the first area AA1.

When the panel protective film PPF is disposed in the bending area BA, a thickness of the display device DD increases at the bending area BA, and thus, bending of the bending area may be difficult. However, according to one or more embodiment, since the panel protective film PPF is not disposed in the bending area BA and the protective film opening OP is defined in the panel protective film PPF instead, the display device DD may be easily bent at the bending area BA.

The second area AA2 and the bending area BA, which do not display the image IM, may define portions of a bezel area of the display device DD which is flat (refer to FIG. 5). Since the second area AA2 is disposed under the first area AA1 within the display device DD which is bent (refer to FIG. 6), the bezel area of the display panel DP may be reduced in a view along the third direction DR3.

In a case where the separate bending protective layer is disposed in the bending area BA, the bending protective layer formed of an acrylic-based resin or a urethane-based resin may have a thickness greater than that of the impact absorbing layer IAL. However, according to one or more embodiment, the impact absorbing layer IAL having a thickness smaller than that of the bending protective layer may be disposed in the bending area BA to protect the bending area BA. Accordingly, an overall thickness of the display device DD at the bending area BA may be reduced. In addition, a conventional bending protective layer is omitted, a manufacturing cost of the display device DD may be reduced, and a process efficiency of the display device DD may be improved.

Figure 7:
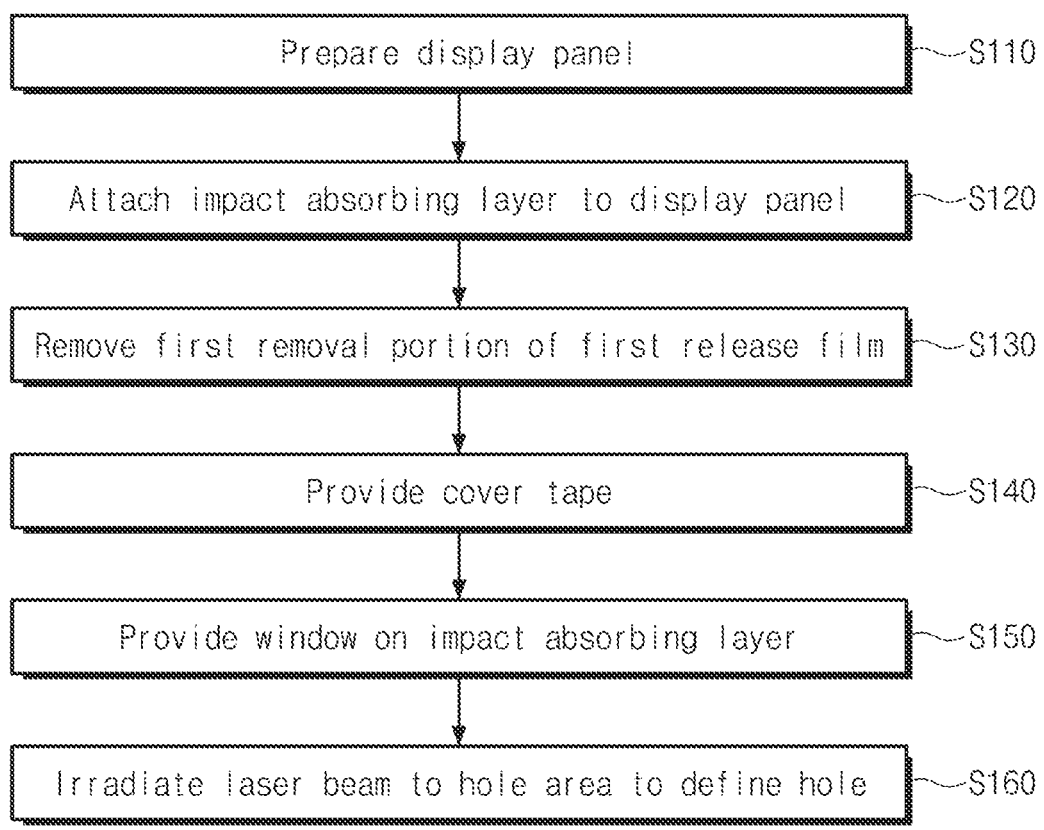
FIG. 7 is a flowchart showing an embodiment of a method of providing a display device.

FIG. 7 is a flowchart showing an embodiment of a method of manufacturing or providing a display device DD. FIGS. 8 to 14 are views showing embodiments of processes in the method of manufacturing the display device DD.

Figure 8:
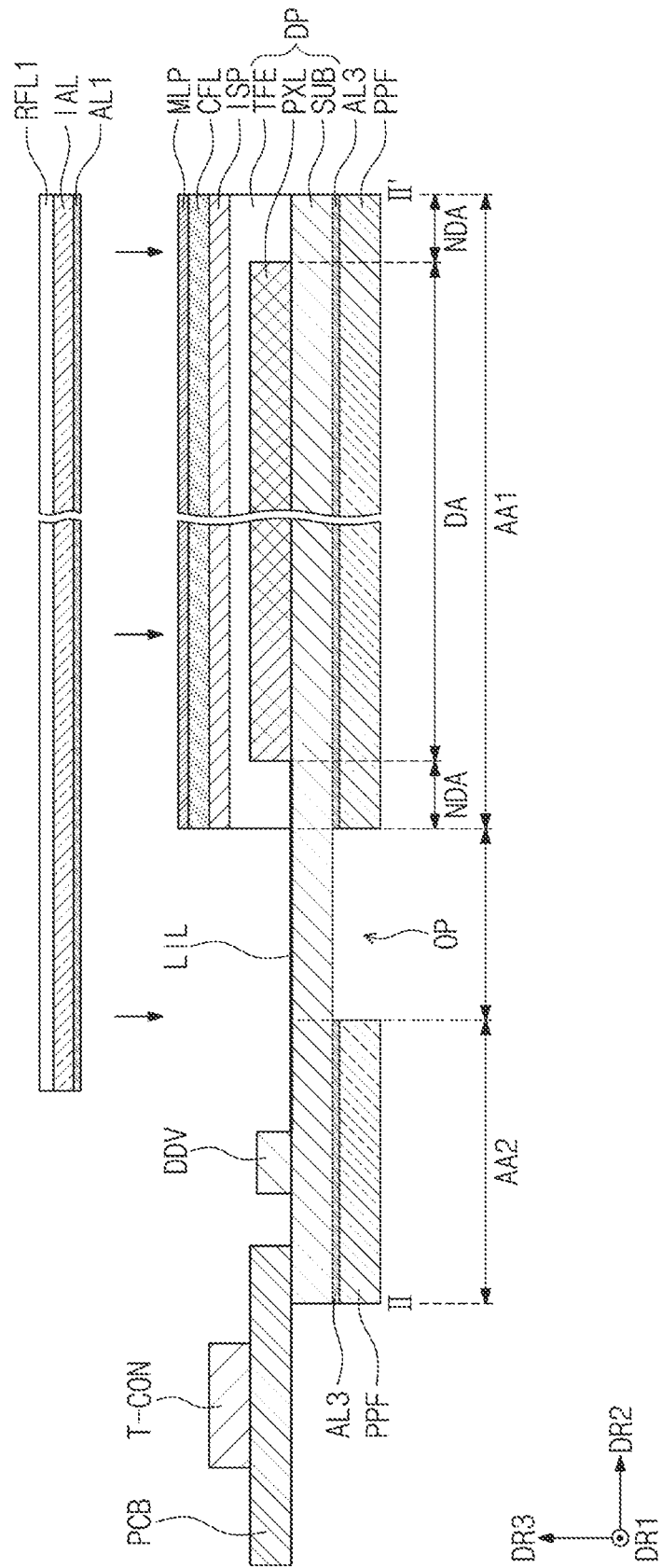
FIGS. 8 to 14 are views showing embodiments of processes of a method of providing a display device.

Referring to FIGS. 7 and 8, the display panel DP may be prepared (S110). The input sensing unit ISP may be provided on the display panel DP in the first area AA1, and the anti-reflective layer CFL may be provided on the input sensing unit ISP. The optical functional layer MLP may be provided on the anti-reflective layer CFL. The data driver DDV may be provided on the display panel DP in the second area AA2.

The portion of the printed circuit board PCB on which the timing controller T-CON is mounted may be provided in the second area AA2 to be spaced apart from the data driver DDV. The impact absorbing layer IAL may be provided on the display panel DP.

A first release film RFL1 may be disposed on the impact absorbing layer IAL. The first adhesive layer AL1 may be disposed under the impact absorbing layer IAL. Although not shown in figures, a second release film may be disposed under the first adhesive layer AL1.

The impact absorbing layer IAL may be disposed between the first release film RFL1 and the second release film and may be protected by the first release film RFL1 and the second release film while being transferred. The first release film RFL1 and the second release film may be easily detached from the impact absorbing layer IAL (e.g., removably attached). The first release film RFL1 and the second release film may include a plastic material such as polyethylene terephthalate (PET).

The second release film may be detached from the impact absorbing layer IAL to attach the impact absorbing layer IAL to the display panel DP.

Figure 9:
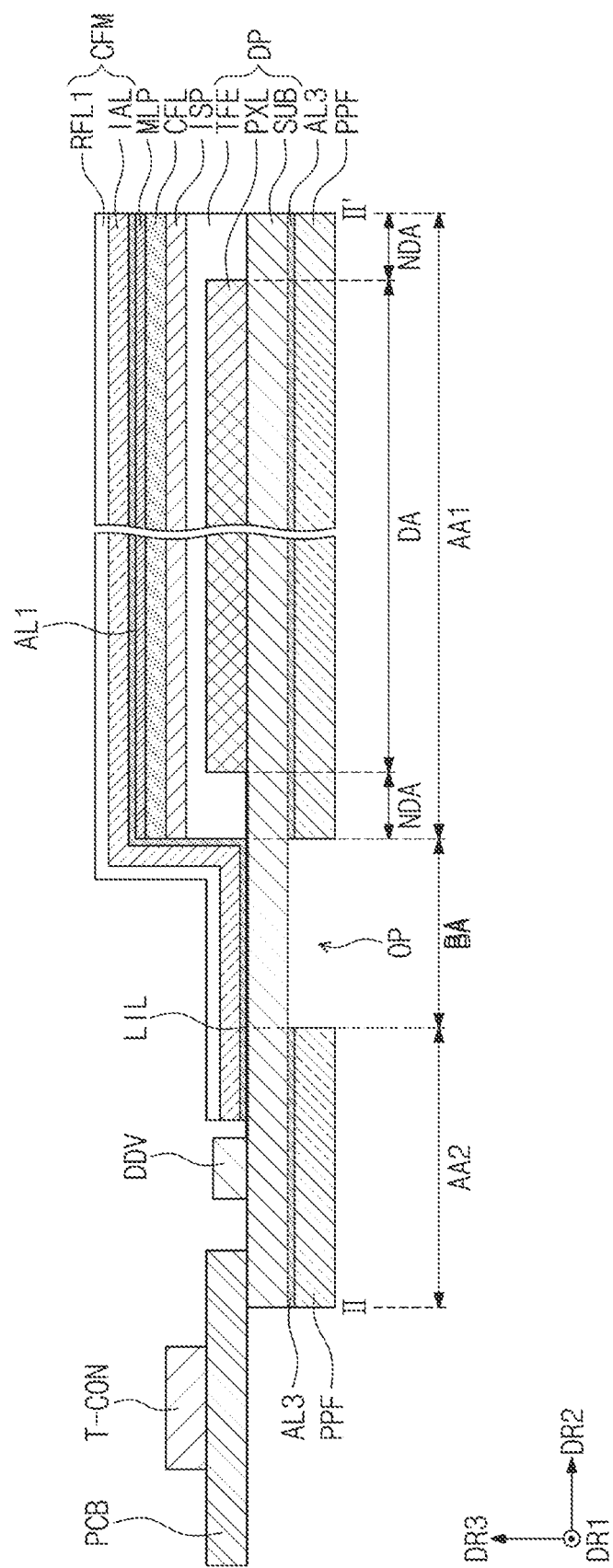

Referring to FIGS. 7 and 9, the impact absorbing layer IAL may be attached to the display panel DP (S120). In detail, the impact absorbing layer IAL may be attached to the display panel DP by the first adhesive layer AL1. The impact absorbing layer IAL may be disposed in the first area AA1 and extend from the first area AA1 to the bending area BA.

The impact absorbing layer IAL may extend from the bending area BA be disposed in the second area AA2 adjacent to the bending area BA and may be spaced apart from the data driver DDV in a direction along the display panel DP. Accordingly, the data driver DDV may be disposed between the impact absorbing layer IAL and the printed circuit board PCB in a direction along the display panel DP.

Figure 10:
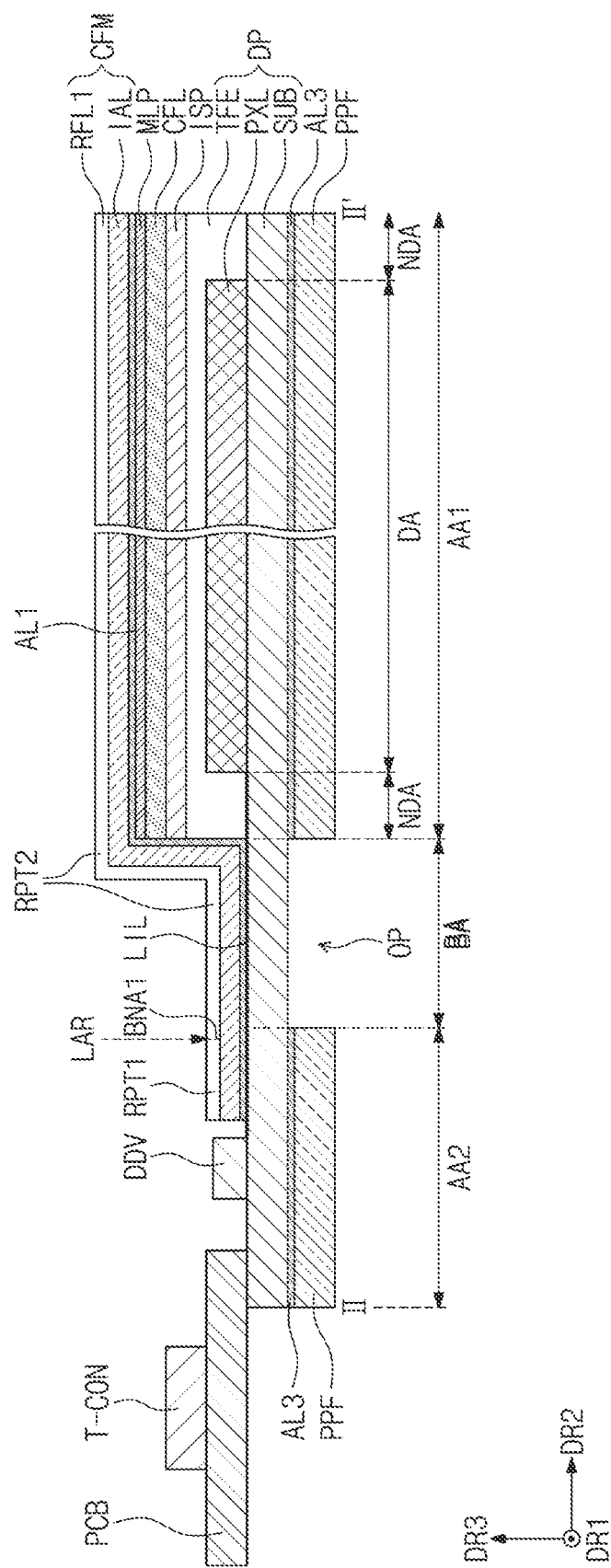

Referring to FIGS. 7 and 10, a first removal portion RPT1 of the first release film RFL1 may be removed (S130). The first release film RFL1 may include the first removal portion RPT1 overlapping or corresponding to the second area AA2 and a second removal portion RPT2 overlapping the bending area BA and the first area AA1 when viewed in a plane. A first boundary BNA1 between the first removal portion RPT1 and the second removal portion RPT2 may be spaced apart from a boundary between the bending area BA and the second area AA2 when viewed in a plane and may overlap the second area AA2, however, should not be limited thereto or thereby. The first boundary BNA1 may be defined at the boundary between the bending area BA and the second area AA2 to be aligned or correspond to the boundary between the bending area BA and the second area AA2.

A laser beam LAR may be irradiated to the first release film RFL1 at the first boundary BNA1 between the first removal portion RPT1 and the second removal portion RPT2 to cut the first release film RFL1 at the first boundary BNA1 between the first removal portion RPT1 and the second removal portion RPT2. The laser beam LAR may be a CO2 laser beam, an ultraviolet (UV) laser beam, or a femtosecond laser beam.

Figure 11:
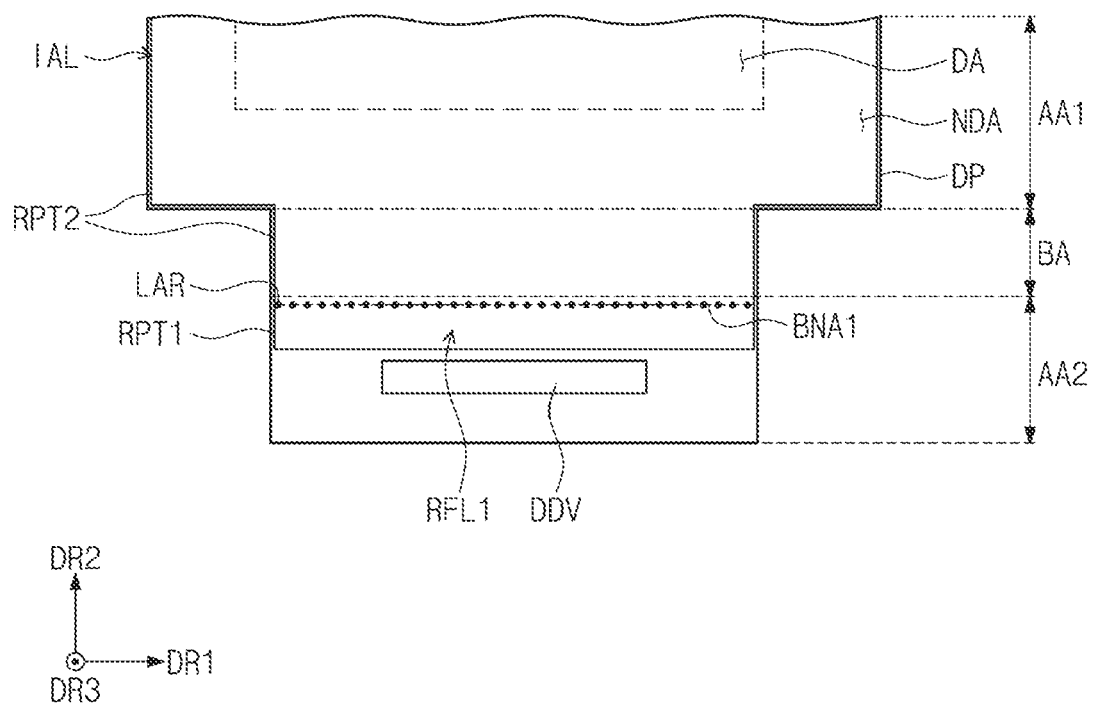

Referring to FIGS. 10 and 11, the laser beam LAR may be irradiated to the first release film RFL1 along the first direction DR1. The laser beam LAR may be irradiated to the first boundary BNA1 multiple times.

As the laser beam LAR is irradiated to the first boundary BNA1 multiple times, a portion of the first release film RFL1 at the first boundary BNA1 may be gradually removed from an upper portion thereof to a lower portion thereof (e.g., in a direction from the impact absorbing layer IAL to the substrate SUB). Accordingly, the first release film RFL1 at the first boundary BNA1 may be cut or disconnected. The laser beam LAR may not be irradiated to the impact absorbing layer IAL.

In a case where the laser beam LAR is irradiated to the first release film RFL1 more times with greater energy, the laser beam LAR may be irradiated to the impact absorbing layer IAL, and the impact absorbing layer IAL may be damaged. A moving speed of the laser beam LAR may also affect a depth of a portion of the first release film RFL1 that is cut. In a case where the laser beam LAR moves slowly, more energy may be applied to the cut portion of the first release film RFL1, and the laser beam LAR may not be irradiated to the impact absorbing layer IAL.

The energy of the laser beam LAR, the moving speed of the laser beam LAR and the number of irradiation times of the laser beam LAR may be determined by taking into account a thickness of the first release film RFL1 to reduce or effectively prevent the laser beam LAR from being irradiated to the impact absorbing layer IAL.

When the first release film RFL1 has the thickness of about 40 micrometers (μm) to about 60 micrometers (μm), the laser beam LAR having the energy of about 5 watts (W) to about 10 W may be irradiated to the first release film RFL1 at the first boundary BNA1 five or six times while moving at the speed of about 300 millimeters per second (mm/s). In this case, the laser beam LAR may be irradiated to the first release film RFL1 and may not be irradiated to the impact absorbing layer IAL.

After the first release film RFL1 at the first boundary BNA1 is cut by the laser beam LAR, the first removal portion RPT1 of the first release film RFL1 may be removed. Removal of the first removal portion RPT1 may expose an end of the impact absorbing layer IAL which is closest to the second area AA2 to outside the first release film RFL1 to define the first portion PT1 as an exposed end portion of the impact absorbing layer IAL.

Figure 12:
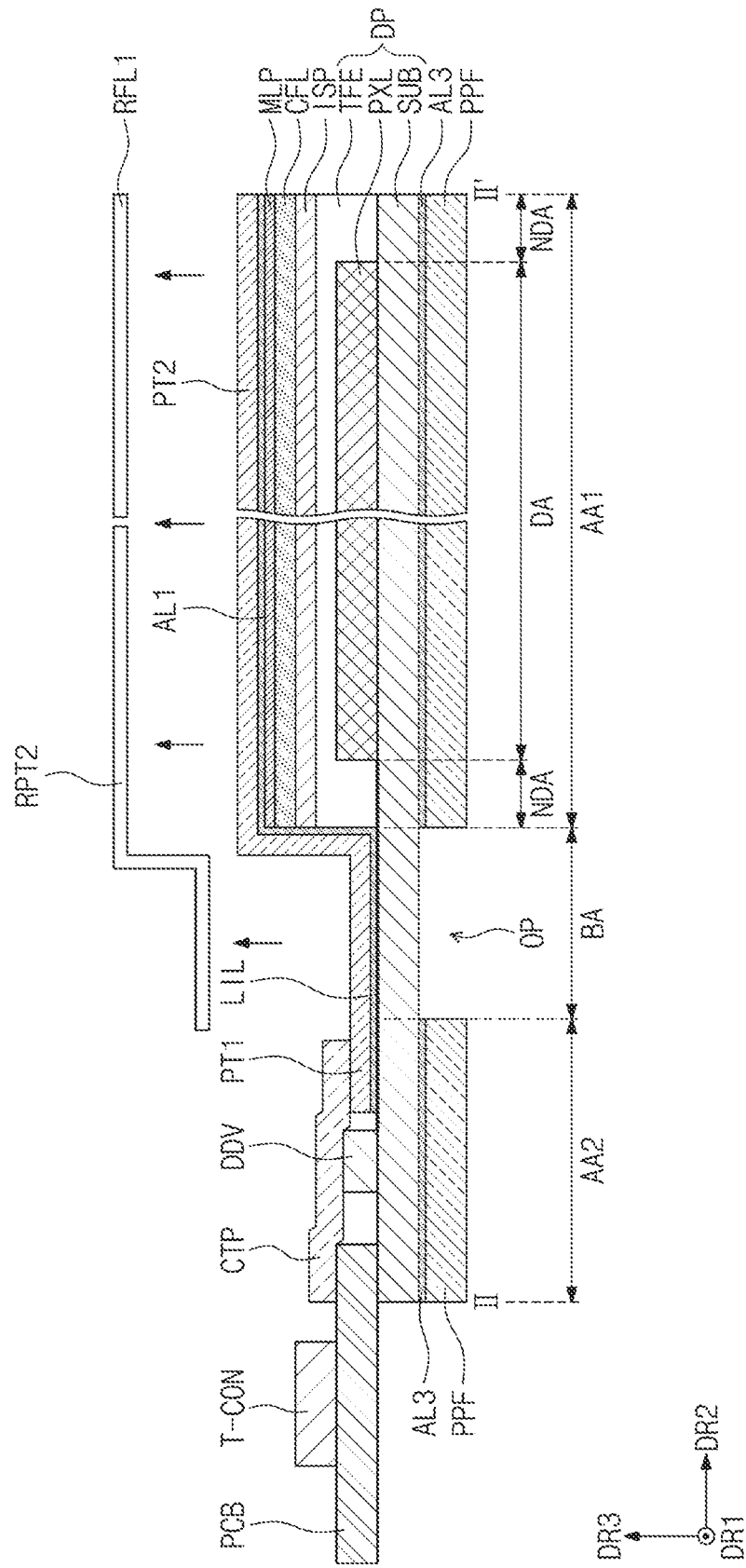

Referring to FIGS. 7 and 12, the cover tape CTP may be provided (S140). The cover tape CTP may be provided on the data driver DDV, the first portion PT1 of the impact absorbing layer IAL from which the first removal portion RPT1 is removed, and the portion of the printed circuit board PCB disposed in the second area AA2.

When viewed in a plane, the edge of the cover tape CTP closest to the bending area BA may be spaced apart from one side surface of the first release film RFL1 in a direction along the substrate SUB.

When viewed in a plane, one side surface of the second removal portion RPT2 may be spaced apart from the edge of the cover tape CTP which is closest to the bending area BA, in the second area AA2.

In the process of attaching the cover tape CTP, it may be difficult for the edge of the cover tape CTP to accurately make contact with or be aligned with the first boundary BNA1. Accordingly, the edge of the cover tape CTP may be disposed to be spaced apart from the one side surface of the second removal portion RPT2 which corresponds to the first boundary BNA1 in consideration of a process tolerance, however, should not be limited thereto or thereby. According to an embodiment, the edge of the cover tape CTP may be disposed to make contact with the one side surface of the second removal portion RPT2 as a guide for attaching the cover tape CTP.

After the cover tape CTP is attached, the display panel DP may be transferred to a process chamber to attach the window WIN. In the conventional process of attaching the cover tape CTP, not only the first removal portion RPT1 but also the second removal portion RPT2 may be removed. In this case, a foreign substance may be adhered onto an upper surface of the impact absorbing layer IAL disposed in the bending area BA and the first area AA1 while the display panel DP is being transferred to the process chamber to attach the window WIN. Defects may occur in the display device DD due to the foreign substance.

According to one or more embodiment, the second removal portion RPT2 disposed in the first area AA1 and the bending area BA may not be removed while the display panel DP is transferred for other processes after the cover tape CTP is attached. That is, the second removal portion RPT2 disposed in the first area AA1 and the bending area BA may remain on the impact absorbing layer IAL while the display panel DP is transferred for other processes after the cover tape CTP is attached. The impact absorbing layer IAL disposed in the first area AA1 and the bending area BA may be protected by the second removal portion RPT2 as the remaining portion of the first release film RFL1. Accordingly, the foreign substance may not be adhered onto the upper surface of the impact absorbing layer IAL disposed in the first area AA1 and the bending area BA while the display panel DP is transferred for other processes.

After the display panel DP is transferred to the process chamber to attach the window WIN, the second removal portion RPT2 may be removed.

Figure 13:
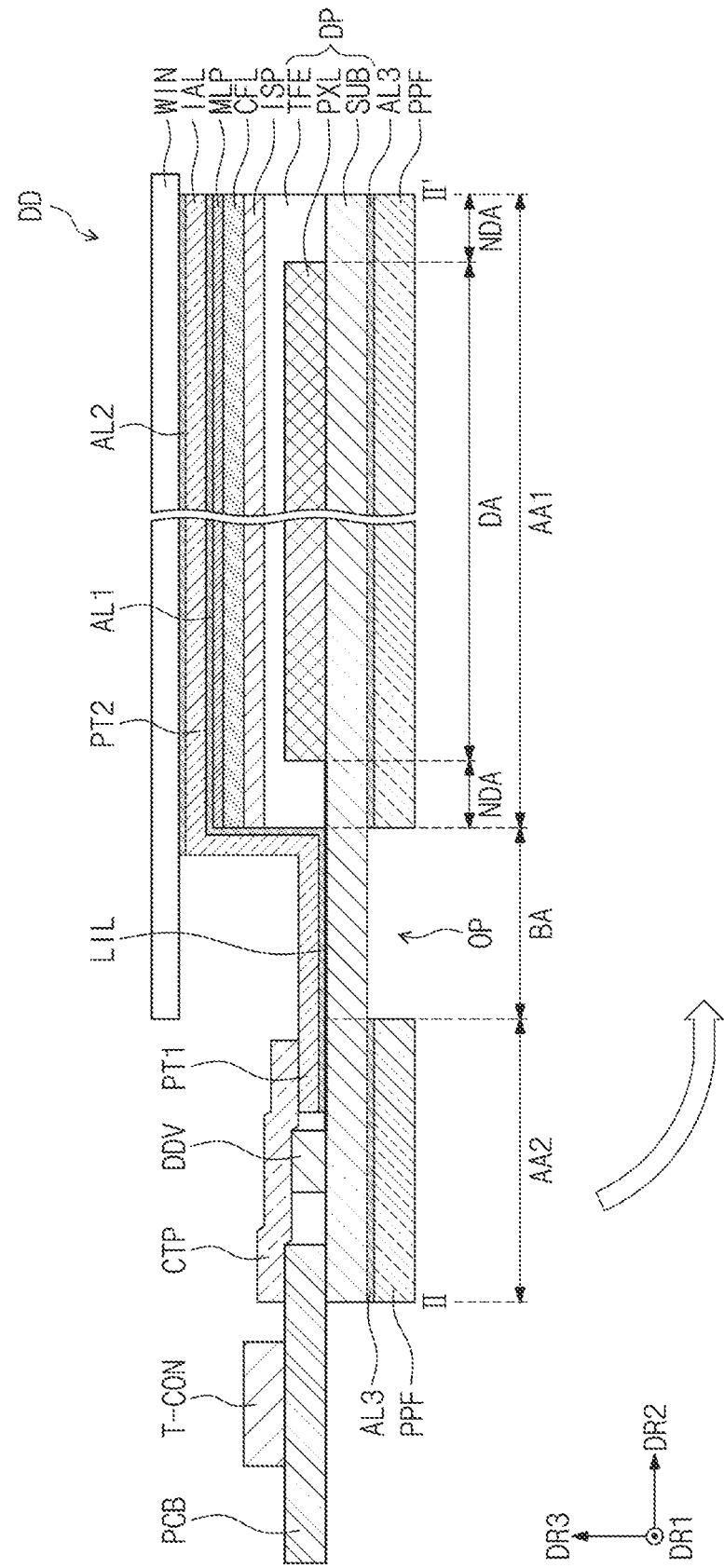

Referring to FIGS. 7 and 13, the window WIN may be disposed on the impact absorbing layer IAL (S150).

The second adhesive layer AL2 may be disposed on the second portion PT2 of the impact absorbing layer IAL. The window WIN is provided in the first area AA1 and the bending area BA, and the window WIN may be disposed on the impact absorbing layer IAL. The second adhesive layer AL2 may be disposed between the second portion PT2 and the window WIN, and the window WIN may be attached to the second portion PT2 by the second adhesive layer AL2.

The display device DD may be bent at the bending area BA (refer to arrow in FIG. 13) such that the second area AA2 is disposed under the first area AA1. Accordingly, as shown in FIG. 6, the bending area BA may be bent to have the predetermined curvature, and thus, the display device DD which is bendable at the bending area BA may be manufactured.

According to an embodiment of the present disclosure, the first removal portion RPT1 of the first release film RFL1 may be removed to attach the cover tape CTP to the first portion PT1 of the impact absorbing layer IAL, and then, the second removal portion RPT2 of the first release film RFL1 may be removed to attach the window WIN to the second portion PT2 of the impact absorbing layer IAL. Accordingly, the impact absorbing layer IAL may be protected at various processes, and the cover tape CTP and the window WIN may be attached to exposed portions of the impact absorbing layer IAL.

Figure 14:
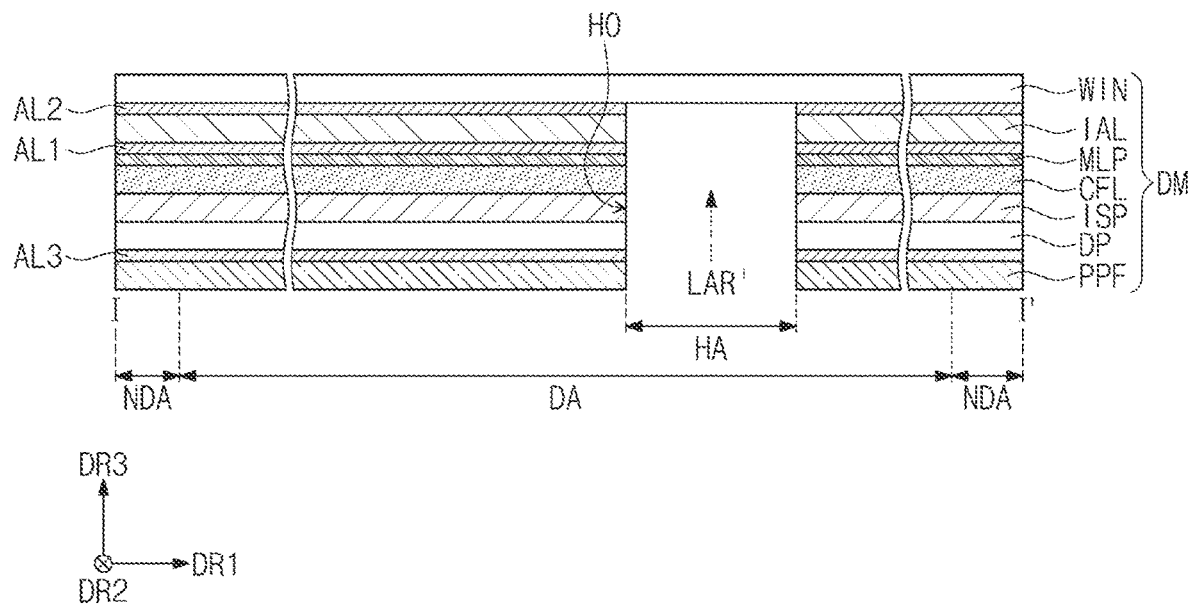

Referring to FIGS. 7 and 14, a laser beam LAR' may be irradiated to the display module DM at the hole area HA to form the hole HO (S150).

The laser beam LAR' may be irradiated to the hole area HA of the display module DM from below the display module DM, e.g., a side opposite to the window WIN. The hole HO may be defined in the hole area HA by the laser beam LAR'. The hole HO may be defined through elements disposed under the window WIN.

Figure 15:
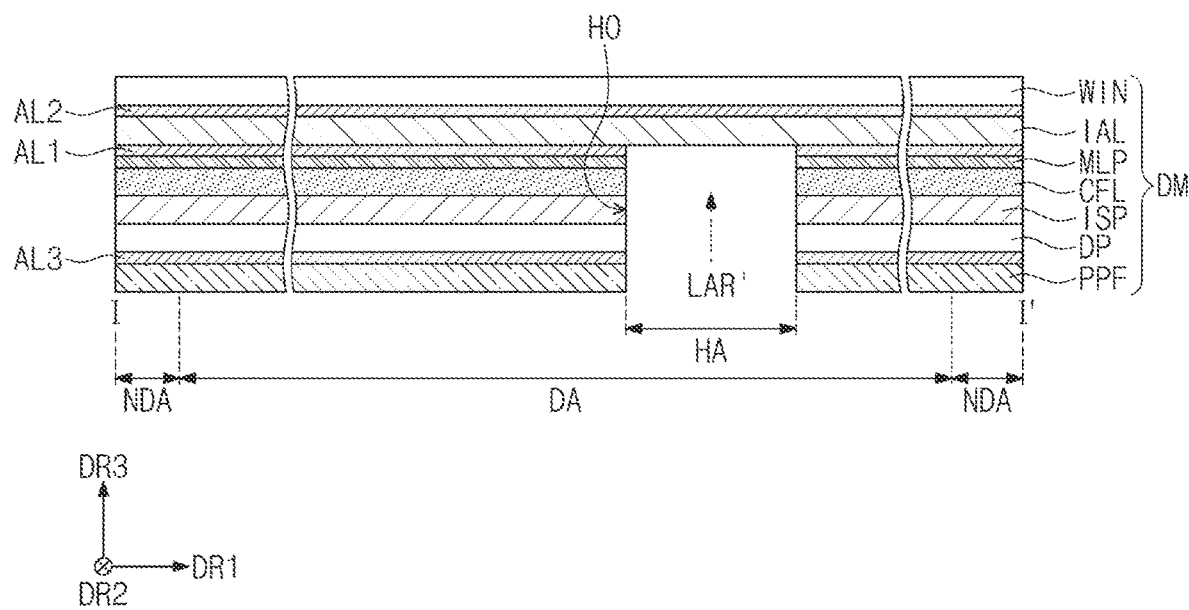
FIG. 15 is a view showing an embodiment of a method of providing a display device.

FIG. 15 is a view showing an embodiment of a method of manufacturing a display device DD.

The manufacturing method of the display device DD in FIG. 15 may be the same as that of the display device DD shown in FIGS. 8 to 13 except that the hole HO defined by the laser beam LAR' in FIG. 14 is different from that in FIG. 15.

Referring to FIG. 15, a laser beam LAR' may be irradiated to a hole area HA of a display module DM from below the display module DM. The hole HO may be defined through an optical functional layer MLP, an anti-reflective layer CFL, an input sensing unit ISP, a display panel DP, a panel protective film PPF, a first adhesive layer AL1 and a third adhesive layer AL3. The hole HO may be defined through elements disposed under the impact absorbing layer IAL. The impact absorbing layer IAL may be exposed to outside the display device DD at the hole area HA.

Figure 16:
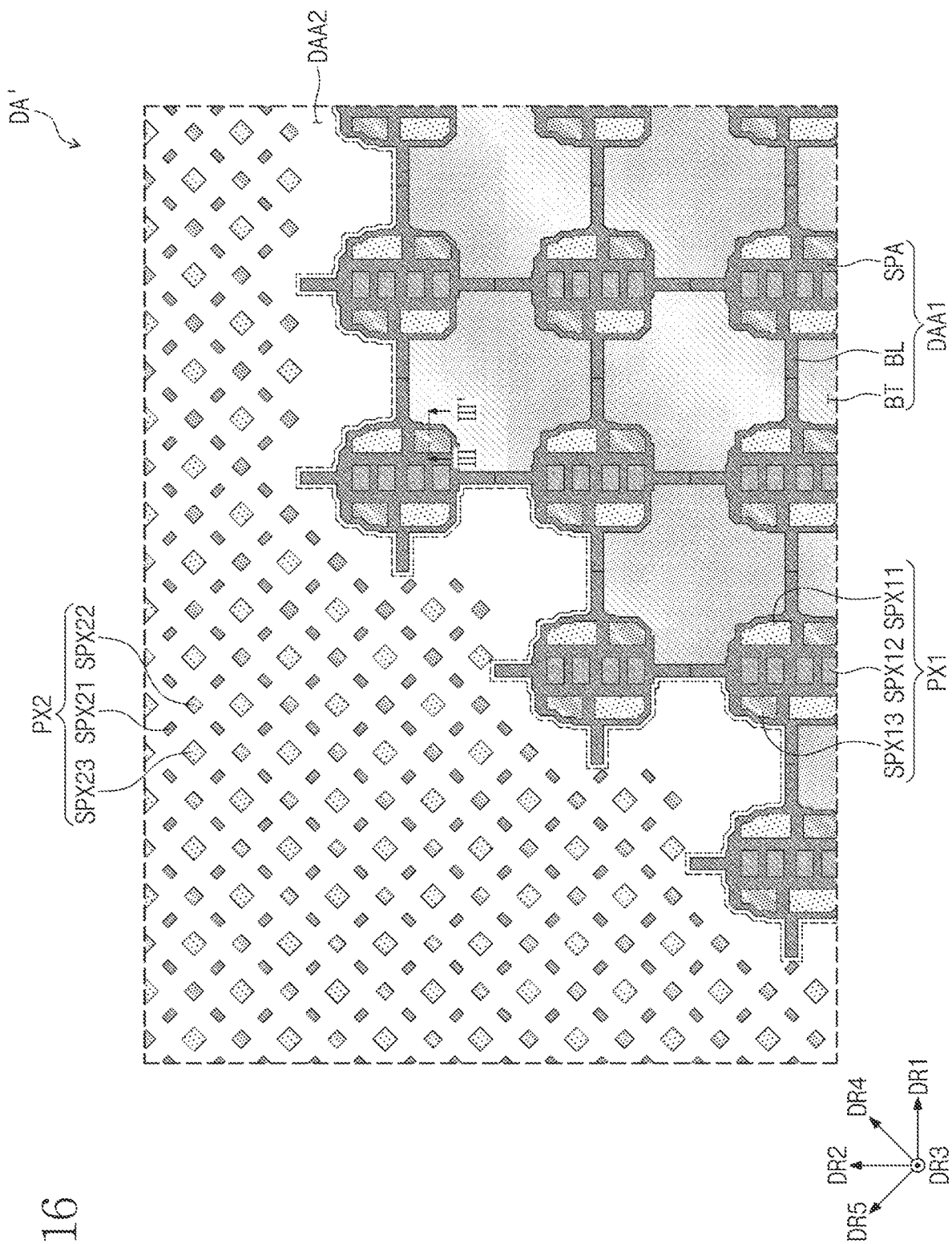
FIG. 16 is a plan view showing an embodiment of a display device.

FIG. 16 is an enlarged plan view showing an embodiment of a portion of a hole area HA of a display area DA'.

Referring to FIG. 16, an area of the display area DA', which corresponds to the hole area HA of FIG. 1, may be defined as a first display area DAA1. A remaining area of the display area DA' except the first display area DAA1 may be defined as a second display area DAA2. The second display area DAA2 may be disposed around the first display area DAA1.

A first pixel PX1 may be disposed in the first display area DAA1. A second pixel PX2 may be disposed in the second display area DAA2. The first pixel PX1 and the second pixel PX2 may have different light emitting areas PA from each other, and the first pixel PX1 and the second pixel PX2 may have different arrangements from each other. The first pixel PX1 may be provided in plural in the first display area DAA1, and the first pixels PX1 may be arranged in the first direction DR1 and the second direction DR2 and may be spaced apart from each other in a direction along the substrate SUB.

The first pixel PX1 may include a plurality of first sub-pixels SPX11, SPX12, and SPX13.

First-first sub-pixels SPX11 may be spaced apart from each other with first-second sub-pixels SPX12 interposed therebetween in the first direction DR1, and two first-first sub-pixels SPX11 spaced apart from each other may be arranged in a diagonal direction along a fourth direction DR4. In the present embodiment, the first-first sub-pixels SPX11 may emit a red light.

The first-second sub-pixels SPX12 may be disposed between the first-first sub-pixels SPX11 and first-third sub-pixels SPX13. In the present embodiment, four of the first-second sub-pixels SPX12 may be arranged in the second direction DR2 and may be spaced apart from each other. According to the present embodiment, the first-second sub-pixels SPX12 may emit a green light.

The first-third sub-pixels SPX13 may be spaced apart from each other with the first-second sub-pixels SPX12 interposed therebetween in the first direction DR1, and two first-third sub-pixels SPX13 spaced apart from each other may be arranged in a diagonal direction along a fifth direction DR5. In the present embodiment, the first-third sub-pixels SPX13 may emit a blue light.

In the present embodiment, one of the first-third sub-pixels SPX13 which is disposed at a left side with respect to the first-second sub-pixels SPX12 may be disposed on one of the first-first sub-pixels SPX11 in the second direction DR2, and another of the first-third sub-pixels SPX13 which is disposed at a right side with respect to the first-second sub-pixels SPX12 may be disposed under another of the first-first sub-pixels SPX11 in the second direction DR2.

A planar area of each of the sub-pixels SPX11, SPX12, and SPX13 may increase in the order of the first-second sub-pixel SPX12, the first-third sub-pixel SPX13, and the first-first sub-pixel SPX11.

Each of the second pixels PX2 may include a plurality of second sub-pixels SPX21, SPX22, and SPX23. The second pixels PX2 may be arranged in the first direction DR1 and the second direction DR2 and may be spaced apart from each other.

In the present embodiment, an arrangement structure of the second sub-pixels SPX21, SPX22, and SPX23 disposed in the second display area DAA2 may be called a Pentile™ structure.

Second-second sub-pixels SPX22 and second-first sub-pixels SPX21 may be alternately arranged along the fourth direction DR4 and the fifth direction DR5. Second-third sub-pixels SPX23 and second-first sub-pixels SPX21 may be alternately arranged along the fourth direction DR4 and the fifth direction DR5. Second-third sub-pixels SPX23 and second-second sub-pixels SPX22 may be alternately arranged along the first direction DR1 and the second direction DR2.

The second-first sub-pixel SPX21 may have a quadrangle shape defined by sides extended along the fourth direction DR4 and the fifth direction DR5. In the present embodiment, the second-first sub-pixel SPX21 may emit the green light. The second-second sub-pixel SPX22 may have a quadrangle shape defined by sides extended along the fourth direction DR4 and the fifth direction DR5. In the present embodiment, the second-second sub-pixel SPX22 may emit the blue light. The second-third sub-pixel SPX23 may have a quadrangle shape defined by sides extended along the fourth direction DR4 and the fifth direction DR5. In the present embodiment, the second-third sub-pixel SPX23 may emit the red light. The planar shape of each of second-first sub-pixel SPX21, second-second sub-pixel SPX22, and the second-third sub-pixel SPX23 is not limited to thereto.

A planar area of each of the sub-pixels SPX21, SPX22, and SPX23 may increase in the order of the second-first sub-pixel SPX21, the second-second sub-pixel SPX22, and the second-third sub-pixel SPX23.

According to the present disclosure, the first display area DAA1 may be divided into a sub-display area SPA, a line area BL, and a transmission area BT. Conductive materials for the pixel PX may be patterned to define patterns of the sub-display area SPA and the line area BL.

Figure 17:
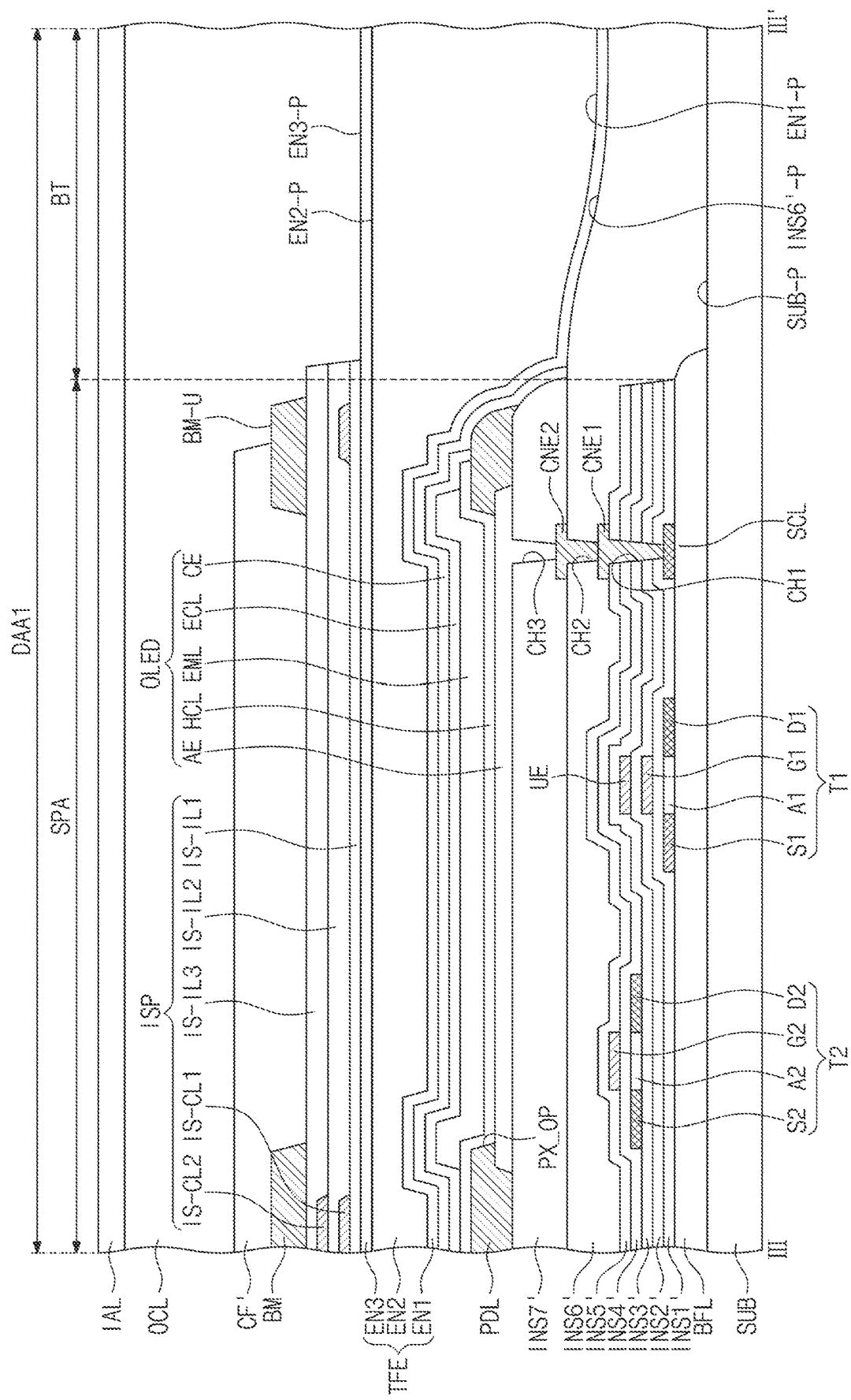
FIG. 17 is a cross-sectional view taken along line III-III' of FIG. 16.

FIG. 17 is a cross-sectional view taken along line of FIG. 16.

For the convenience of explanation, in FIG. 17, the same reference numerals denote the same elements in FIG. 4, and thus, detailed descriptions of the same elements will be omitted.

Referring to FIG. 17, a first semiconductor pattern may be disposed on a buffer layer BFL. A source S1, an active A1, and a drain D1 of a first transistor T1 may be formed of the first semiconductor pattern. The source S1 and the drain D1 of the first transistor T1 may be spaced apart from each other with the active A1 interposed therebetween.

A connection signal line SCL may be disposed on the buffer layer BFL. Although not shown in figures, the connection signal line SCL may be connected to a drain area of another transistor.

A first insulating layer INS1' may be disposed on the buffer layer BFL and may cover the first semiconductor pattern. A gate G1 of the first transistor T1 may be disposed on the first insulating layer INS1'. The gate G1 may be a portion of a metal pattern. The gate G1 of the first transistor T1 may overlap the active A1 of the first transistor T1. The gate G1 of the first transistor T1 may serve as a mask in a process of doping the first semiconductor pattern.

A second insulating layer INS2' may be disposed on the first insulating layer INS1' to cover the gate G1. An upper electrode UE may be disposed on the second insulating layer INS2'. The upper electrode UE may overlap the gate G1. The upper electrode UE may be a portion of the metal pattern or a portion of the doped semiconductor pattern. The portion of the gate G1 and the upper electrode UE which overlaps the portion of the gate G1 may together form a capacitor. According to an embodiment, the upper electrode UE may be omitted.

The second insulating layer INS2' may be replaced with an insulating pattern. The upper electrode UE may be disposed on the insulating pattern. The upper electrode UE may serve as a mask when the insulating pattern is formed from the second insulating layer INS2'.

A semiconductor pattern may be disposed on a third insulating layer INS3'. Hereinafter, the semiconductor pattern disposed directly on the third insulating layer INS3' may be referred to as a second semiconductor pattern. The second semiconductor pattern may include metal oxide. The oxide semiconductor may include a crystalline or amorphous oxide semiconductor.

As an example, the oxide semiconductor may include metal oxide of zinc (Zn), indium (In), gallium (Ga), tin (Sn), titanium (Ti), etc., or a combination of metal, such as zinc (Zn), indium (In), gallium (Ga), tin (Sn), titanium (Ti), etc., and oxide thereof. The oxide semiconductor may include indium tin oxide (ITO), indium gallium zinc oxide (IGZO), zinc oxide (ZnO), indium zinc oxide (IZnO), zinc indium oxide (ZIO), indium oxide (InO), titanium oxide (TiO), indium zinc tin oxide (IZTO), zinc tin oxide (ZTO), etc.

A source S2, an active A2, and a drain D2 of a second transistor T2 may be formed from the second semiconductor pattern. The source S2 and the drain D2 may include a metal reduced from a metal oxide semiconductor. The source S2 and the drain D2 may have a thickness from an upper surface of the second semiconductor pattern and along the third direction DR3 and may include a metal layer including the reduced metal.

A fourth insulating layer INS4' may be disposed on the third insulating layer INS3' to cover the second semiconductor pattern. In the present embodiment, the fourth insulating layer INS4' may have a single-layer structure of a silicon oxide layer. A gate G2 of the second transistor T2 may be disposed on the fourth insulating layer INS4'. The gate G2 may be a portion of the metal pattern. The gate G2 of the second transistor T2 may overlap the active A2 of the second transistor T2.

According to an embodiment of the present disclosure, the fourth insulating layer INS4' may be replaced with an insulating pattern. The gate G2 of the second transistor T2 may be disposed on the insulating pattern. In the present embodiment, the gate G2 may have the same shape as that of the insulating pattern when viewed in a plane.

A fifth insulating layer INS5' may be disposed on the fourth insulating layer INS4' to cover the gate G2. In the present embodiment, the fifth insulating layer INS5' may include a silicon oxide layer and a silicon nitride layer. The fifth insulating layer INS5' may include a plurality of silicon oxide layers and a plurality of silicon nitride layers which are alternately staked with the silicon oxide layers.

At least one insulating layer may be further disposed on the fifth insulating layer INS5'. As described in FIG. 17, a sixth insulating layer INS6' and a seventh insulating layer INS7' may be disposed on the fifth insulating layer INS5'. Each of the sixth insulating layer INS6' and the seventh insulating layer INS7' may be an organic layer and may have a single-layer or multi-layer structure. Each of the sixth insulating layer INS6' and the seventh insulating layer INS7' may have a single-layer structure of a polyimide-based resin layer, however, should not be limited thereto or thereby. According to an embodiment, each of the sixth insulating layer INS6' and the seventh insulating layer INS7' may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin.

A first connection electrode CNE1 may be disposed on the fifth insulating layer INS5'. The first connection electrode CNE1 may be connected to the connection signal line SCL or a connection electrode via a first contact hole CH1 defined through the first to fifth insulating layers INS1' to INS5'.

A second connection electrode CNE2 may be disposed on the sixth insulating layer INS6'. The second connection electrode CNE2 may be connected to the first connection electrode CNE1 via a second contact hole CH2 defined through the sixth insulating layer INS6'.

A light emitting element OLED may be disposed on the seventh insulating layer INS7'. A first electrode AE of the light emitting element OLED may be disposed on the seventh insulating layer INS7'. A pixel definition layer PDL may be disposed on the seventh insulating layer INS7'.

A color filter CF' may overlap a light emitting layer EML. The color filter CF' may selectively transmit a light corresponding to a light provided from the light emitting layer EML. As an example, when the light emitting layer EML provides a blue light, the color filter CF' may be a blue color filter that transmits the blue light.

The color filter CF' may include a polymer photosensitive resin and a pigment or dye. As an example, the color filter CF' overlapping the light emitting layer EML providing the blue light may include a blue pigment or dye, the color filter CF' overlapping the light emitting layer EML providing a green light may include a green pigment or dye, and the color filter CF' overlapping the light emitting layer EML providing a red light may include a red pigment or dye.

However, the color filter CF' should not be limited thereto or thereby, and the color filter CF' overlapping the light emitting layer EML providing the blue light may not include the pigment or dye. In this case, the color filter CF' may be transparent, and the color filter CF' may be formed of a transparent photosensitive resin. A division pattern BM may be disposed between the color filters providing different lights from each other.

A protective layer OCL may be disposed on the color filter CF' and the division pattern BM. The protective layer OCL may cover concave-convex portions formed when the color filter CF' and the division pattern BM are formed and may provide a flat surface. That is, the protective layer OCL may be a planarization layer.

In the first display area DAA1, the transmission area BT may be an area in which conductive materials or insulating layers are patterned or are not deposited to increase a light transmittance.

The transmission area BT may be defined by excluding insulating layers overlapping the transmission area BT among the first to seventh insulating layers INS1' to INS7'.

Among the first to seventh insulating layers INS1' to INS7', the first insulating layer INS1', the second insulating layer INS2', the third insulating layer INS3', the fourth insulating layer INS4', the fifth insulating layer INS5', and the seventh insulating layer INS7', which overlap the transmission area BT, may not be deposited or may be patterned to be removed after being deposited.

In addition, among sensing insulating layers IS-IL1, IS-IL2, and IS-IL3, portions of the sensing insulating layers IS-IL1, IS-IL2, and IS-IL3, which overlap the transmission area BT, may not be deposited or may be patterned to be removed after being deposited. Accordingly, portions of the sensing insulating layers IS-IL1, IS-IL2, and IS-IL3 adjacent to the transmission area BT may be etched to provide a step difference defined by side surfaces of the sensing insulating layers IS-IL1, IS-IL2, and IS-IL3.

In the present embodiment, only a substrate portion SUB-P, a sixth insulating layer portion INS6'-P, a first encapsulation layer portion EN1-P, a second encapsulation layer portion EN2-P, a third encapsulation layer portion EN3-P, and the protective layer OCL which covers the third encapsulation layer portion EN3-P may be disposed in the transmission area BT.

Accordingly, the buffer layer BFL, the first to fifth insulating layers INS1' to INS5', the seventh insulating layer INS7', the first sensing insulating layer IS-IL1, the second sensing insulating layer IS-IL2, the third sensing insulating layer IS-IL3, the color filter CF', and the division pattern BM, which overlap the sub-display area SPA, may not overlap the transmission area BT. In addition, elements of the light emitting element OLED may not overlap the transmission area BT. That is, these elements may be excluded from the transmission area BT to increase a light transmittance therethrough.

According to the present embodiment, a top surface BM-U of the division pattern BM, which is disposed adjacent to the transmission area BT, may be in contact with the protective layer OCL without being covered by the color filter CF'. That is, the upper surface BM-U may be exposed to outside the color filter CF'.

In an embodiment, each of the first display area DAA1 and the second display area DAA2 has a light transmittance, the light transmittance of the first display area DAA1 being higher than the light transmittance of the second display area DAA2, and within the first display area DAA1, the light transmittance at the transmission area BT being higher than the light transmittance at the first pixel PX1.

The second encapsulation layer EN2 of the thin film encapsulation layer TFE may include portions having different thicknesses from each other to compensate for the step difference of the insulating layers that are not deposited in the transmission area BT or that are patterned after being deposited. As an example, the organic layer of the second encapsulation layer EN2, which overlaps the transmission area BT, may have a thickness greater than the largest thickness of the organic layer of the second encapsulation layer EN2, which overlaps the second display area DAA2 and the sub-display area SPA.

An impact absorbing layer IAL may be disposed on the display panel DP. That is, the impact absorbing layer IAL may be disposed in the first display area DAA1 and the second display area DAA2. The display panel DP may be protected by the impact absorbing layer IAL. Although not shown in FIG. 17, an optical functional layer MLP may be further disposed between the protective layer OCL and the impact absorbing layer IAL, however, should not be limited thereto or thereby. According to an embodiment, the impact absorbing layer IAL may be disposed on the display panel DP including the second display area DAA2 and may be provided with a hole HO defined therethrough to overlap the first display area DAA1.

As the impact absorbing layer IAL is provided with the hole HO defined therethrough in the area overlapping the first display area DAA1, the light transmittance of the first display area DAA1 may be improved. Accordingly, although the camera CAM (refer to FIG. 2) is disposed in the first display area DAA1, the display device DD may include the camera CAM with improved performance.

Although embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the invention shall be determined according to the attached claims.

What is claimed is:

1. A method of manufacturing a display device, the method comprising:
   preparing a display panel comprising a display area, a bending area extending from the display area, and a non-display area extending from the bending area;
   at each of the display area, the bending area and the non-display area:
      providing an impact absorbing layer on the display panel; and
      providing a first release film on the impact absorbing layer;
   providing a first removal portion of the first release film separated from the impact absorbing layer at the non-display area to expose a first portion of the impact absorbing layer to outside the first release film; and
   providing a cover tape on the first portion of the impact absorbing layer which is exposed to outside the first release film.

2. The method of claim 1, wherein
   the impact absorbing layer includes the first portion and a second portion which is adjacent to the first portion and corresponds to the display area and the bending area, and
   the providing of the first removal portion of the first release film separated from the impact absorbing layer at the non-display area provides a second removal portion of the first release film which corresponds to the second portion of the impact absorbing layer.

3. The method of claim 2, further comprising:
   providing a first boundary of the first release film which is between the first removal portion and the second removal portion, and
   providing a laser beam to the first boundary of the first release film which is between the first removal portion and the second removal portion to separate the first removal portion and the second removal portion at the first boundary.

4. The method of claim 3, wherein
   the first release film has a thickness of about 40 micrometers to about 60 micrometers, and
   in the providing of the laser beam to the first boundary, the laser beam is provided to the first boundary multiple times at a speed of about 300 millimeters per second, is not irradiated to the impact absorbing layer, and has an energy of about 5 watts to about 10 watts.

5. The method of claim 3, wherein the first boundary of the first release film corresponds to the non-display area of the display panel.

6. The method of claim 3, wherein the first boundary of the first release film corresponds a boundary between the non-display area and the bending area of the display panel.

7. The method of claim 1, further comprising providing in order:
the display panel;
an input sensing layer;
a color filter layer;
the impact absorbing layer; and
a window corresponding to the display area and the bending area of the display panel.

8. The method of claim 1, wherein the providing of the impact absorbing layer includes continuously extending the impact absorbing layer from the display area to the non-display area via the bending area.

9. The method of claim 1, wherein the impact absorbing layer comprises polyethylene terephthalate, polyethylene naphthalate, polycarbonate, cyclo-olefin polymer, polyethersulfone, polyarylate or polyimide.

10. The method of claim 1, further comprising irradiating a laser beam to a hole area defined in the display panel and the impact absorbing layer to form a hole through the display panel.

11. The method of claim 1, wherein
the non-display area of the display panel includes a driving integrated circuit, and
the providing of the impact absorbing layer includes spacing the impact absorbing layer in the non-display area apart from the driving integrated circuit in the non-display area.

12. The method of claim 1, further comprising irradiating a laser beam to a hole area defined in the display panel to form a hole.

13. A display device comprising:
a display panel comprising a display area including pixels, a bending area extending from the display area, and a non-display area extending from the bending area;
a driving integrated circuit in the non-display area;
an impact absorbing layer on the display panel, the impact absorbing layer overlapping the pixels of the display area and continuously extending from the display area to the non-display area via the bending area; and
a window facing the display panel with the impact absorbing layer therebetween,
wherein the impact absorbing layer in the non-display area is spaced apart from the driving integrated circuit in the non-display area.

14. The display device of claim 13, wherein
the display panel and the impact absorbing layer together define a hole therethrough, and
the hole corresponds to a functional element of the display device which provides a function thereto.

15. The display device of claim 13, wherein
the display panel defines a hole therethrough,
the hole corresponds to a functional element of the display device which provides a function thereto, and
the hole does not extend into the impact absorbing layer.

16. The display device of claim 13, further comprising a functional element of the display device which provides a function thereto,
wherein
the display area comprises:
a first display area which corresponds to the functional element of the display device, the first display area comprising a first pixel among the pixels and a transmission area which is adjacent to the first pixel, and
a second display area which is adjacent to the first display area, the second display area comprising a second pixel among the pixels,
each of the first display area and the second display area has a light transmittance,
the light transmittance of the first display area is higher than the light transmittance of the second display area,
within the first display area, the light transmittance at the transmission area is higher than the light transmittance at the first pixel, and
the impact absorbing layer is in both the first display area and the second display area.

17. The display device of claim 13, further comprising a functional element of the display device which provides a function thereto,
wherein
the display area comprises:
a first display area which corresponds to the functional element of the display device, the first display area comprising a first pixel among the pixels and a transmission area which is adjacent to the first pixel; and
a second display area which is adjacent to the first display area, the second display area comprising a second pixel among the pixels,
the impact absorbing layer is in the second display area, and
the impact absorbing layer defines a hole corresponding to the first display area.

18. The display device of claim 13, further comprising:
a first portion of the impact absorbing layer corresponding to the non-display area, and
a cover tape on the first portion of the impact absorbing layer and the driving integrated circuit.

19. The display device of claim 13, wherein the impact absorbing layer comprises polyethylene terephthalate, polyethylene naphthalate, polycarbonate, cyclo-olefin polymer, polyethersulfone, polyarylate or polyimide.

20. The display device of claim 13, wherein the impact absorbing layer has a thickness of about 20 micrometers to about 200 micrometers.

* * * * *